United States Patent
Spohn et al.

(10) Patent No.: US 8,518,482 B2
(45) Date of Patent: *Aug. 27, 2013

(54) BUBBLER APPARATUS AND METHOD FOR DELIVERING VAPOR PHASE REAGENT TO A DEPOSITION CHAMBER

(75) Inventors: Ronald F. Spohn, Getzville, NY (US); David Walter Peters, Kingsland, TX (US)

(73) Assignee: Praxair Technology, Inc., Danbury, CT (US)

( * ) Notice: Subject to any disclaimer, the term of this patent is extended or adjusted under 35 U.S.C. 154(b) by 1163 days.

This patent is subject to a terminal disclaimer.

(21) Appl. No.: 12/014,228

(22) Filed: Jan. 15, 2008

(65) Prior Publication Data
US 2008/0182425 A1  Jul. 31, 2008

Related U.S. Application Data

(60) Provisional application No. 60/898,121, filed on Jan. 29, 2007, provisional application No. 60/903,720, filed on Feb. 27, 2007, provisional application No. 60/897,947, filed on Jan. 29, 2007, provisional application No. 60/903,579, filed on Feb. 27, 2007.

(51) Int. Cl.
*C23C 16/00* (2006.01)

(52) U.S. Cl.
USPC .......... 427/248.1; 422/63; 422/500; 422/501; 422/502; 422/503; 222/3

(58) Field of Classification Search
USPC ................ 422/99–100, 63, 500–503; 222/3; 427/248.1
See application file for complete search history.

(56) References Cited

U.S. PATENT DOCUMENTS

| | | | |
|---|---|---|---|
| 3,266,311 A | 8/1966 | Andersen et al. |
| 3,329,447 A | 7/1967 | Hitz |
| 3,826,139 A | 7/1974 | Bachman |
| 3,930,591 A | 1/1976 | Hawerkamp |
| 4,676,404 A | 6/1987 | Yamazaki et al. |
| 4,899,585 A | 2/1990 | Kulha |
| 5,102,010 A | 4/1992 | Osgar et al. |
| 5,366,119 A | 11/1994 | Kline |
| 5,366,120 A | 11/1994 | Tollasepp |

(Continued)

FOREIGN PATENT DOCUMENTS

| | | |
|---|---|---|
| DE | 3428713 A1 | 11/1985 |
| WO | WO 96/09483 | 3/1996 |
| WO | WO 01/98690 A1 | 12/2001 |
| WO | WO 2005/054522 A1 | 6/2005 |

*Primary Examiner* — Jyoti Nagpaul
(74) *Attorney, Agent, or Firm* — Nilay S. Dalal; Iurie A. Schwartz

(57) ABSTRACT

This invention relates to a vapor phase reagent dispensing apparatus having a bubbler tube and also a metal seal aligned and in contact with the hardened opposing flat surfaces of a top wall member and a protuberance on a side wall member, wherein the hardened opposing flat surfaces of the top wall member and the protuberance have a hardness greater than the hardness of the metal seal. The apparatus further has a temperature sensor and a source chemical level sensor extending through a centrally located portion of the top wall member and generally vertically downwardly to a sump cavity centrally located on a bottom wall member. The dispensing apparatus may be used for dispensing of reagents such as precursors for deposition of materials in the manufacture of semiconductor materials and devices.

30 Claims, 12 Drawing Sheets

(56) References Cited

U.S. PATENT DOCUMENTS

| | | |
|---|---|---|
| 5,372,754 A | 12/1994 | Ono |
| 5,383,970 A | 1/1995 | Asaba et al. |
| 5,388,574 A | 2/1995 | Ingebrethsen |
| 5,435,460 A | 7/1995 | Osgar |
| 5,526,956 A | 6/1996 | Osgar |
| 5,582,647 A | 12/1996 | Kato et al. |
| 5,749,500 A | 5/1998 | Kraus et al. |
| 6,029,717 A | 2/2000 | Siegele et al. |
| 6,077,356 A | 6/2000 | Bouchard |
| 6,257,446 B1 | 7/2001 | Pike |
| 6,736,154 B2 | 5/2004 | Xu et al. |
| 6,905,125 B2 | 6/2005 | Shibata et al. |
| 7,077,388 B2 | 7/2006 | Stamp et al. |
| 2003/0132257 A1 | 7/2003 | Fiebig |
| 2004/0086642 A1 | 5/2004 | Kesala |
| 2008/0178809 A1* | 7/2008 | Spohn et al. ............... 118/726 |
| 2008/0179767 A1* | 7/2008 | Spohn et al. ............... 261/135 |
| 2008/0182010 A1* | 7/2008 | Spohn et al. ............. 427/96.8 |
| 2008/0182023 A1* | 7/2008 | Spohn et al. ........... 427/255.28 |
| 2008/0213476 A1* | 9/2008 | Spohn et al. ........... 427/255.23 |

* cited by examiner

BUBBLER APPARATUS AND METHOD FOR DELIVERING VAPOR PHASE REAGENT TO A DEPOSITION CHAMBER

RELATED APPLICATIONS

This application claims the benefit of U.S. Provisional Application Ser. No. 60/898,121, filed on Jan. 29, 2007; U.S. Provisional Application Ser. No. 60/903,720, filed on Feb. 27, 2007; U.S. Provisional Application Ser. No. 60/897,947, filed on Jan. 29, 2007; and U.S. Provisional Application Ser. No. 60/903,579, filed on Feb. 27, 2007; all of which are incorporated herein by reference. This application is related to U.S. patent application Ser. No. 11/013,434, filed Dec. 17, 2004; U.S. patent application Ser. No. 12/014,248, Jan. 15, 2008; U.S. patent application Ser. No. 12/014,270, filed Jan. 15, 2008; U.S. patent application Ser. No. 12/014,282, filed Jan. 15, 2008 and issued Jun. 14, 2011 as U.S. Pat. No. 7,959,994; U.S. patent application Ser. No. 12/014,194, filed Jan. 15, 2008; and U.S. patent application Ser. No. 12/014,237, filed Jan. 15, 2008; all of which are incorporated herein by reference.

FIELD OF THE INVENTION

This invention relates to a vapor phase reagent dispensing apparatus that may be used for dispensing vapor phase reagents such as precursors for deposition of materials in the manufacture of semiconductor materials and devices.

BACKGROUND OF THE INVENTION

High purity chemicals used in the semiconductor and pharmaceutical industries require special packaging to maintain their purity in storage. This is especially true for chemicals that react with air and/or moisture in the air. Such high purity chemicals are typically supplied in containers such as bubblers or ampoules.

Modern chemical vapor deposition and atomic layer deposition tools utilize bubblers or ampoules to deliver precursor chemicals to a deposition chamber. These bubblers or ampoules work by passing a carrier gas through a container of high purity liquid precursor chemical and carrying the precursor vapor along with the gas to the deposition chamber.

The containers are typically manufactured as either one-part (i.e., the top cover or lid is not removable from the base) or two-part (i.e., the top cover or lid is removable from the base and can be attached to the base by bolts) containers. The one-part containers have a high degree of integrity, but are more difficult to clean than the two-part containers. Because the top cover or lid can be removed from the base, the two-part containers are easier to clean but are more difficult to seal and reuse. Easier cleaning allows for the reuse of a two-part container beyond what may be achieved with a one-part container. Reuse of containers is important for minimizing costs and also for environmental concerns.

As integrated circuits have decreased in size, so have the dimensions of the internal components or features. As the sizes decreased, the need for more pure chemicals has correspondingly increased to minimize the effect of impurities. Suppliers therefore, must be able to not only manufacture high purity chemicals, but must also be able to deliver them in a container which will maintain the high purity.

The standard materials of construction for these containers shifted from the delicate quartz containers to stainless steel in the late 1990's. See, for example, U.S. Pat. No. 5,607,002. These containers are known in the industry either as bubblers or ampoules and are now routinely constructed of stainless steel, e.g., 316SS. See, for example, U.S. Pat. Nos. 3,930,591, 6,029,717 and 7,077,388.

Further, in most cases, it is necessary to heat the ampoule by some means in order to increase the vapor pressure of the precursor and thus increase the amount of chemical in the carrier gas. It is important to monitor the temperature of the liquid precursor chemical inside of the ampoule to control the vapor pressure.

It is also important to know when the liquid precursor chemical inside of the ampoule is close to running out so that it can be changed at the end of a chemical vapor deposition or atomic layer deposition cycle. If the ampoule should run dry in the middle of a cycle, the entire batch of wafers will be ruined resulting in a potential loss of millions of dollars. It is therefore desirable to leave as little liquid precursor chemical as possible inside of the ampoule to avoid wasting the valuable liquid precursor chemical. As the cost of chemical precursors increase, wasting as little chemical as possible becomes more important.

For two-part high-purity chemical containers to gain commercial acceptance, it will be necessary to develop a more reliable seal. U.S. Pat. No. 6,905,125 relates to a metal gasket such as C-ring gasket to prevent leakage of fluid from semiconductor manufacturing apparatus. High purity chemicals for the electronics industry require leak-tight containers that are able to withstand high vacuum.

It would be desirable in the art to provide an easy to clean, two-part vapor or liquid phase reagent dispensing apparatus which is capable of maintaining high purity of the precursor chemical and also increasing the usage of the precursor chemical in the apparatus, and correspondingly reducing waste thereof.

SUMMARY OF THE INVENTION

This invention relates in part to a vapor phase reagent dispensing apparatus comprising:

a vessel which comprises a removable top wall member, a sidewall member and a bottom wall member configured to form an internal vessel compartment to hold a source chemical up to a fill level and to additionally define an inner gas volume above the fill level;

said sidewall member having a protuberance that extends into the internal vessel compartment adjacent to the top wall member;

said top wall member and said sidewall member having opposing flat surfaces, wherein the opposing flat surfaces are optionally in contact with one another;

fastening means for securing said top wall member to said sidewall member through the opposing flat surfaces that are optionally in contact with one another;

said top wall member and said protuberance having opposing flat surfaces, wherein the opposing flat surfaces are not in contact with one another and at least a portion of the opposing flat surfaces are hardened;

a metal seal aligned and in contact with the hardened opposing flat surfaces of said top wall member and said protuberance;

said bottom wall member having a main floor surface containing a sump cavity therein extending downwardly from the main floor surface, the sump cavity being bounded at its lower end by a sub-floor surface, with at least a portion of the sump cavity being centrally located on the bottom wall member and at least a portion of the sump cavity being non-centrally located on the bottom wall member;

a temperature sensor extending from an upper end exterior of the vessel through a centrally located portion of the top wall member and generally vertically downwardly through the inner gas volume into the source chemical to a lower end of that portion of the sump cavity centrally located on the bottom wall member, with the lower end of the temperature sensor being located in non-interfering proximity to the sub-floor surface of the sump cavity;

a source chemical level sensor extending from an upper end exterior of the vessel through a non-centrally located portion of the top wall member and generally vertically downwardly through the inner gas volume into the source chemical to a lower end of that portion of the sump cavity non-centrally located on the bottom wall member, with the lower end of the source chemical level sensor being located in non-interfering proximity to the sub-floor surface of the sump cavity;

the temperature sensor being operatively arranged in the sump cavity to determine the temperature of source chemical in the vessel, the source chemical level sensor being operatively arranged in the sump cavity to determine the level of source chemical in the vessel, the temperature sensor and source chemical level sensor being located in non-interfering proximity to each other in the sump cavity, with the lower end of the temperature sensor being located at the same or closer proximity to the sub-floor surface of the sump cavity in relation to the lower end of the source chemical level sensor, and the temperature sensor and source chemical level sensor being in source chemical flow communication in the sump cavity; and a non-centrally located portion of the top wall member having a carrier gas feed inlet opening comprising a bubbler tube that extends through the inner gas volume into the source chemical and through which said carrier gas can be bubbled into the source chemical to cause at least a portion of source chemical vapor to become entrained in said carrier gas to produce a flow of vapor phase reagent to said inner gas volume above the fill level, said bubbler tube having an inlet end adjacent to the top wall member and an outlet end adjacent to the bottom wall member; and a non-centrally located portion of the top wall member having a vapor phase reagent outlet opening through which said vapor phase reagent can be dispensed from said apparatus;

wherein said hardened opposing flat surfaces of said top wall member and said protuberance have a hardness greater than the hardness of said metal seal.

This invention also relates in part to a method for delivery of a vapor phase reagent to a deposition chamber comprising:

(a) providing a vapor phase reagent dispensing apparatus comprising:

a vessel which comprises a removable top wall member, a sidewall member and a bottom wall member configured to form an internal vessel compartment to hold a source chemical up to a fill level and to additionally define an inner gas volume above the fill level;

said sidewall member having a protuberance that extends into the internal vessel compartment adjacent to the top wall member;

said top wall member and said sidewall member having opposing flat surfaces, wherein the opposing flat surfaces are optionally in contact with one another;

fastening means for securing said top wall member to said sidewall member through the opposing flat surfaces that are optionally in contact with one another;

said top wall member and said protuberance having opposing flat surfaces, wherein the opposing flat surfaces are not in contact with one another and at least a portion of the opposing flat surfaces are hardened;

a metal seal aligned and in contact with the hardened opposing flat surfaces of said top wall member and said protuberance;

said bottom wall member having a main floor surface containing a sump cavity therein extending downwardly from the main floor surface, the sump cavity being bounded at its lower end by a sub-floor surface, with at least a portion of the sump cavity being centrally located on the bottom wall member and at least a portion of the sump cavity being non-centrally located on the bottom wall member;

a temperature sensor extending from an upper end exterior of the vessel through a centrally located portion of the top wall member and generally vertically downwardly through the inner gas volume into the source chemical to a lower end of that portion of the sump cavity centrally located on the bottom wall member, with the lower end of the temperature sensor being located in non-interfering proximity to the sub-floor surface of the sump cavity;

a source chemical level sensor extending from an upper end exterior of the vessel through a non-centrally located portion of the top wall member and generally vertically downwardly through the inner gas volume into the source chemical to a lower end of that portion of the sump cavity non-centrally located on the bottom wall member, with the lower end of the source chemical level sensor being located in non-interfering proximity to the sub-floor surface of the sump cavity;

the temperature sensor being operatively arranged in the sump cavity to determine the temperature of source chemical in the vessel, the source chemical level sensor being operatively arranged in the sump cavity to determine the level of source chemical in the vessel, the temperature sensor and source chemical level sensor being located in non-interfering proximity to each other in the sump cavity, with the lower end of the temperature sensor being located at the same or closer proximity to the sub-floor surface of the sump cavity in relation to the lower end of the source chemical level sensor, and the temperature sensor and source chemical level sensor being in source chemical flow communication in the sump cavity;

a non-centrally located portion of the top wall member having a carrier gas feed inlet opening comprising a bubbler tube that extends through the inner gas volume into the source chemical and through which said carrier gas can be bubbled into the source chemical to cause at least a portion of source chemical vapor to become entrained in said carrier gas to produce a flow of vapor phase reagent to said inner gas volume above the fill level, said bubbler tube having an inlet end adjacent to the top wall member and an outlet end adjacent to the bottom wall member;

a carrier gas feed line extending from the carrier gas feed inlet opening upwardly and exteriorly from the top wall member for delivery of carrier gas into said source chemical, the carrier gas feed line containing a carrier gas flow control valve therein for control of flow of the carrier gas therethrough;

a non-centrally located portion of the top wall member having a vapor phase reagent outlet opening through which said vapor phase reagent can be dispensed from said apparatus; and a vapor phase reagent discharge line extending from the vapor phase reagent outlet opening upwardly and exteriorly from the top wall member for removal of vapor phase reagent from said inner gas volume above the fill level, the vapor phase reagent discharge line containing a vapor phase reagent flow control valve therein for control of flow of the vapor phase reagent therethrough;

wherein said hardened opposing flat surfaces of said top wall member and said protuberance have a hardness greater than the hardness of said metal seal;

adding source chemical at ambient temperature to said vapor phase reagent dispensing apparatus;

heating the source chemical in said vapor phase reagent dispensing apparatus to a temperature sufficient to vaporize the source chemical to provide vapor phase reagent;

feeding a carrier gas into said vapor phase reagent dispensing apparatus through said carrier gas feed line and said bubbler tube;

withdrawing the vapor phase reagent and carrier gas from said vapor phase reagent dispensing apparatus through said vapor phase reagent discharge line; and feeding the vapor phase reagent and carrier gas into said deposition chamber.

By acting at the end of the vapor phase reagent dispensing operation on a reduced cross-section, the increased height liquid volume in the sump cavity in accordance with this invention, the source chemical level sensor and temperature sensor are able to monitor the source chemical level and temperature to a closer approach to complete source chemical utilization.

The vapor phase reagent dispensing apparatus or assembly of the invention may be employed in a wide variety of process systems, including for example chemical vapor deposition systems wherein the vapor phase reagent from the supply vessel is passed to a chemical vapor deposition chamber for deposition of a material layer on a substrate therein from the source vapor.

The vapor phase reagent dispensing apparatus or assembly of the invention is easy to clean because of the removable top wall member, maintains purity of the liquid precursor chemical, increases usage rate of the liquid or solid precursor chemical and thereby reduces waste.

Other aspects, features and embodiments of the invention will be more fully apparent from the ensuing disclosure and appended claims.

BRIEF DESCRIPTION OF THE DRAWINGS

In FIG. 2A and FIG. 2B, two or more intersecting circular depressions or wells can serve as a sump cavity. In FIG. 2C, two or more circular depressions or wells joined by a connecting trench can serve as a sump cavity.

DETAILED DESCRIPTION OF THE INVENTION

Figure 1:
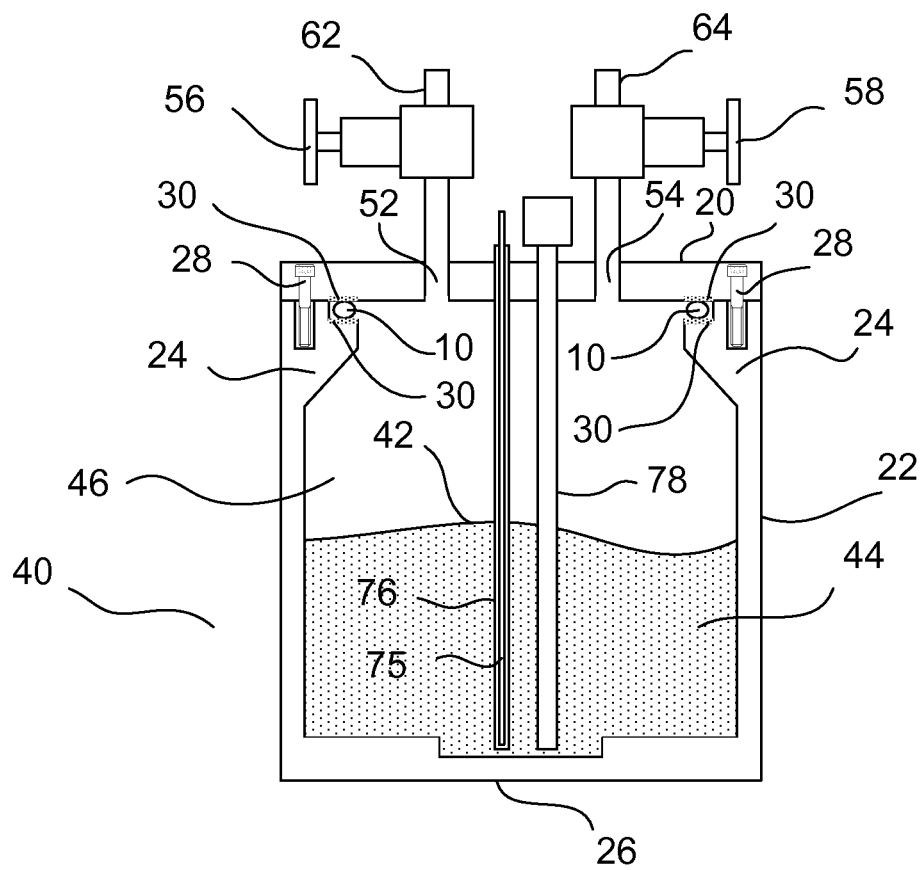
FIG. 1 is a schematic representation of a vapor phase reagent dispensing apparatus shown in partial cross-section.
Figure 2:
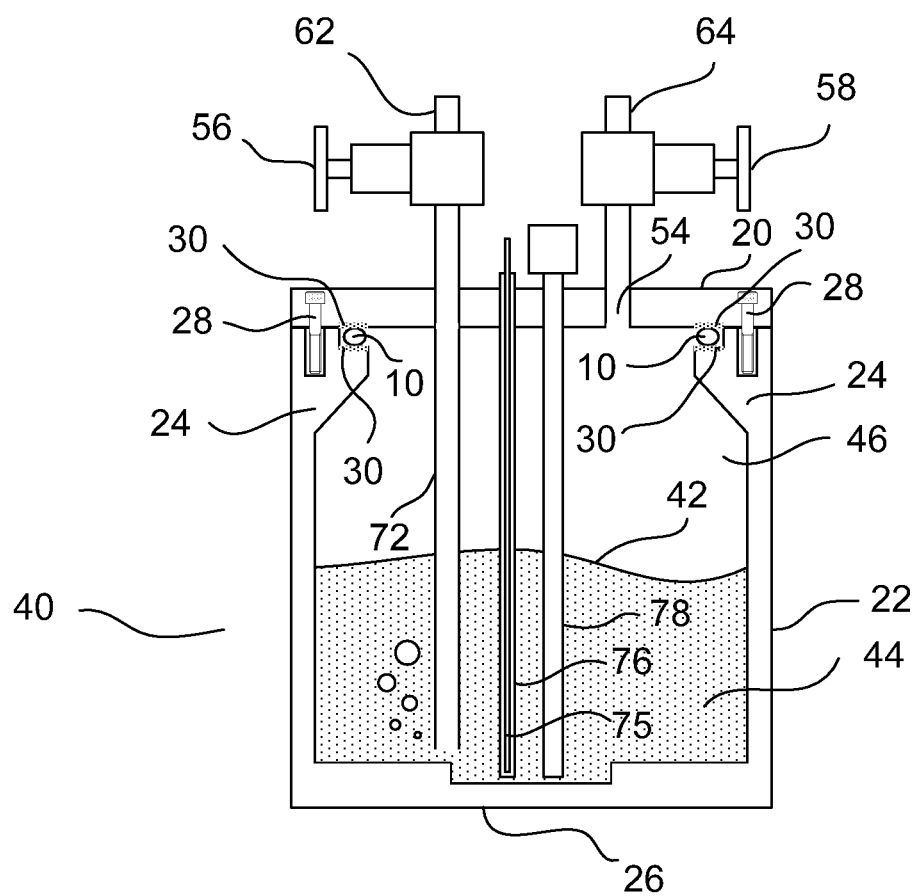
FIG. 2 is a schematic representation of a vapor phase reagent dispensing apparatus shown in partial cross-section.
Figure 3:
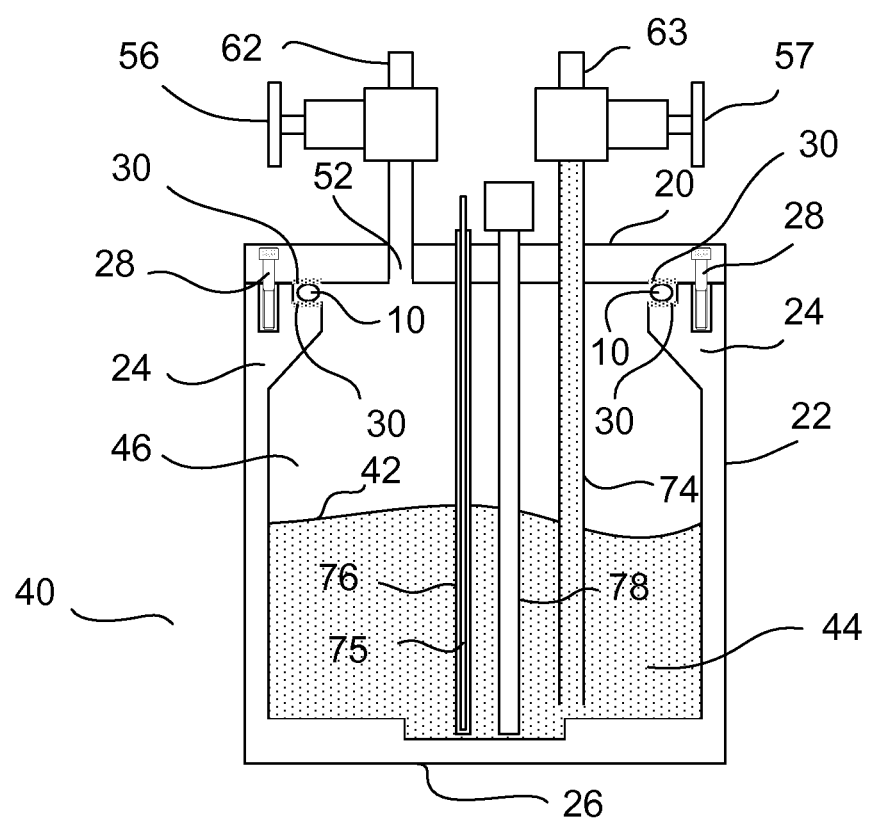
FIG. 3 is a schematic representation of a liquid phase reagent dispensing apparatus shown in partial cross-section.

As indicated above, this invention relates in part to a vapor or liquid phase reagent dispensing apparatus. Referring to FIGS. 1, 2 and 3, an illustrative vapor or liquid phase reagent dispensing apparatus comprises:

a vessel 40 which comprises a removable top wall member 20, a sidewall member 22 and a bottom wall member 26 configured to form an internal vessel compartment to hold a source chemical 44 up to a fill level 42 and to additionally define an inner gas volume 46 above the fill level 42;

said sidewall member 22 having a protuberance 24 that extends into the internal vessel compartment adjacent to the top wall member 20;

said top wall member 20 and said sidewall member 22 having opposing flat surfaces, wherein the opposing flat surfaces are optionally in contact with one another;

fastening means 28 for securing said top wall member 20 to said sidewall member 22 through the opposing flat surfaces that are optionally in contact with one another;

said top wall member 20 and said protuberance 24 having opposing flat surfaces, wherein the opposing flat surfaces are not in contact with one another and at least a portion of the opposing flat surfaces are hardened 30;

a metal seal 10 aligned and in contact with the hardened opposing flat surfaces 30 of said top wall member 20 and said protuberance 24, wherein said hardened opposing flat surfaces 30 of said top wall member 20 and said protuberance 24 have a hardness greater than the hardness of said metal seal 10;

said bottom wall member 26 having a main floor surface containing a sump cavity therein extending downwardly from the main floor surface, the sump cavity being bounded at its lower end by a sub-floor surface, with at least a portion of the sump cavity being centrally located on the bottom wall member 26 and at least a portion of the sump cavity being non-centrally located on the bottom wall member 26;

a temperature sensor 75 (i.e., thermocouple) and 76 (i.e., thermowell) extending from an upper end exterior of the vessel 40 through a centrally located portion of the top wall member 20 and generally vertically downwardly through the inner gas volume 46 into the source chemical 44 to a lower end of that portion of the sump cavity centrally located on the bottom wall member 26, with the lower end of the temperature sensor 75 and 76 being located in non-interfering proximity to the sub-floor surface of the sump cavity;

a source chemical level sensor 78 extending from an upper end exterior of the vessel 40 through a non-centrally located portion of the top wall member 20 and generally vertically downwardly through the inner gas volume 46 into the source chemical 44 to a lower end of that portion of the sump cavity non-centrally located on the bottom wall member 26, with the lower end of the source chemical level sensor 78 being located in non-interfering proximity to the sub-floor surface of the sump cavity; and the temperature sensor 75 and 76 being operatively arranged in the sump cavity to determine the temperature of source chemical 44 in the vessel 40, the source chemical level sensor 78 being operatively arranged in the sump cavity to determine the level of source chemical 44 in the vessel 40, the temperature sensor 75 and 76 and source chemical level sensor 78 being located in non-interfering proximity to each other in the sump cavity, with the lower end of the temperature sensor 75 and 76 being located at the same or closer proximity to the sub-floor surface of the sump cavity in relation to the lower end of the source chemical level sensor 78, and the temperature sensor 75 and 76 and source chemical level sensor 78 being in source chemical flow communication in the sump cavity.

Referring to FIG. 1, the vapor phase reagent dispensing apparatus further comprises a portion of the top wall member 20 having a carrier gas feed inlet opening 52 through which carrier gas can be fed into said inner gas volume 46 above the fill level 42 to cause vapor of said source chemical 44 to become entrained in said carrier gas to produce vapor phase reagent; and a portion of the top wall member 20 having a vapor phase reagent outlet opening 54 through which said vapor phase reagent can be dispensed from said apparatus.

The vapor phase reagent dispensing apparatus, as depicted in FIG. 1, further comprises a carrier gas feed line 62 extending from the carrier gas feed inlet opening 52 upwardly and exteriorly from the top wall member 20 for delivery of carrier gas into said inner gas volume 46 above the fill level 42, the carrier gas feed line 62 containing a carrier gas flow control valve 56 therein for control of flow of the carrier gas therethrough; and a vapor phase reagent discharge line 64 extending from the vapor phase reagent outlet opening 54 upwardly and exteriorly from the top wall member 20 for removal of vapor phase reagent from said inner gas volume 46 above the fill level 42, the vapor phase reagent discharge line 64 containing a vapor phase reagent flow control valve 58 therein for control of flow of the vapor phase reagent therethrough.

FIG. 1 is an embodiment of U.S. patent application Ser. No. 12/014,194, filed Jan. 15, 2008, and incorporated herein by reference.

Referring to FIG. 2, the vapor phase reagent dispensing apparatus further comprises a portion of the top wall member 20 having a carrier gas feed inlet opening comprising a bubbler tube 72 that extends through the inner gas volume 46 into the source chemical 44 and through which said carrier gas can be bubbled into the source chemical 44 to cause at least a portion of source chemical vapor to become entrained in said carrier gas to produce a flow of vapor phase reagent to said inner gas volume 46 above the fill level 42, said bubbler tube 72 having an inlet end adjacent to the top wall member 20 and an outlet end adjacent to the bottom wall member 26; and a portion of the top wall member 20 having a vapor phase reagent outlet opening 54 through which said vapor phase reagent can be dispensed from said apparatus.

The vapor phase reagent dispensing apparatus, as depicted in FIG. 2, further comprises a carrier gas feed line 62 extending from the carrier gas feed inlet opening upwardly and exteriorly from the top wall member 20 for delivery of carrier gas into said source chemical 44, the carrier gas feed line containing a carrier gas flow control valve 56 therein for control of flow of the carrier gas therethrough; and a vapor phase reagent discharge line 64 extending from the vapor phase reagent outlet opening 54 upwardly and exteriorly from the top wall member 20 for removal of vapor phase reagent from said inner gas volume 46 above the fill level 42, the vapor phase reagent discharge line 64 containing a vapor phase reagent flow control valve 58 therein for control of flow of the vapor phase reagent therethrough.

Referring to FIG. 3, the liquid phase reagent dispensing apparatus further comprises a portion of the top wall member 20 having an inert gas feed inlet opening 52 through which said inert gas can be fed into the inner gas volume 46 above the fill level 42 to pressurize the inner gas volume above the fill level 42; and a portion of the top wall member 20 having a liquid phase reagent outlet opening comprising a diptube 74 that extends through the inner gas volume 46 into the source chemical 44 and through which liquid phase reagent can be dispensed from said apparatus, said diptube 74 having an outlet end adjacent to the top wall member 20 and an inlet end adjacent to the bottom wall member 26.

The liquid phase reagent dispensing apparatus, as depicted in FIG. 3, further comprises an inert gas feed line 62 extending from the inert gas feed inlet opening 52 upwardly and exteriorly from the top wall member 20 for delivery of inert gas into said inner gas volume 46 above the fill level 42, the inert gas feed line 62 containing an inert gas flow control valve 56 therein for control of flow of the inert gas therethrough; and a liquid phase reagent discharge line 63 extending from the liquid phase reagent outlet opening upwardly and exteriorly from the top wall member 20 for removal of liquid phase reagent from said vessel 40, the liquid phase reagent discharge line 63 containing a liquid phase reagent flow control valve 57 therein for control of flow of the liquid phase reagent therethrough.

FIG. 3 is an embodiment of U.S. patent application Ser. No. 12/014,237, filed Jan. 15, 2008, and incorporated herein by reference.

The vessel or ampoule is typically machined from stainless steel, e.g., 316L, and electropolished to prevent contamination of the precursor liquid or solid source chemical. The cover or top wall member is removable to facilitate cleaning and reuse. The vessel can comprise a cylindrically shaped side wall member or side wall members defining a non-cylindrical shape. The metal seal is aligned and is in contact with the hardened opposing flat surfaces of the top wall member and the protuberance to provide a leak tight seal for the vessel or ampoule. The metal material used in the metal seal, e.g., outer metal jacket, is preferably 316L stainless steel like the vessel or ampoule.

Figure 4:
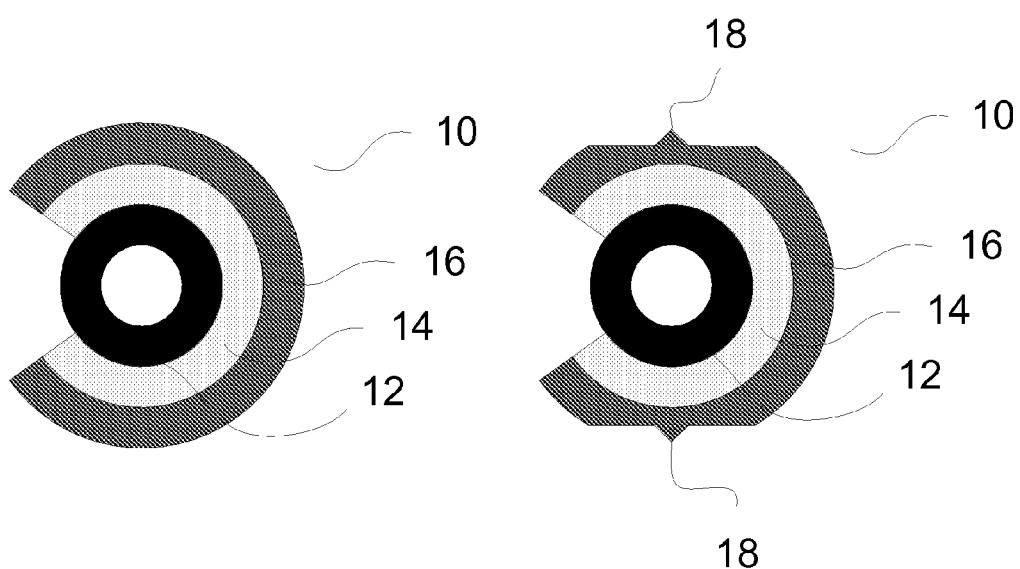
FIG. 4 is a representation of two metal seals shown in cross-section.
Figure 6:
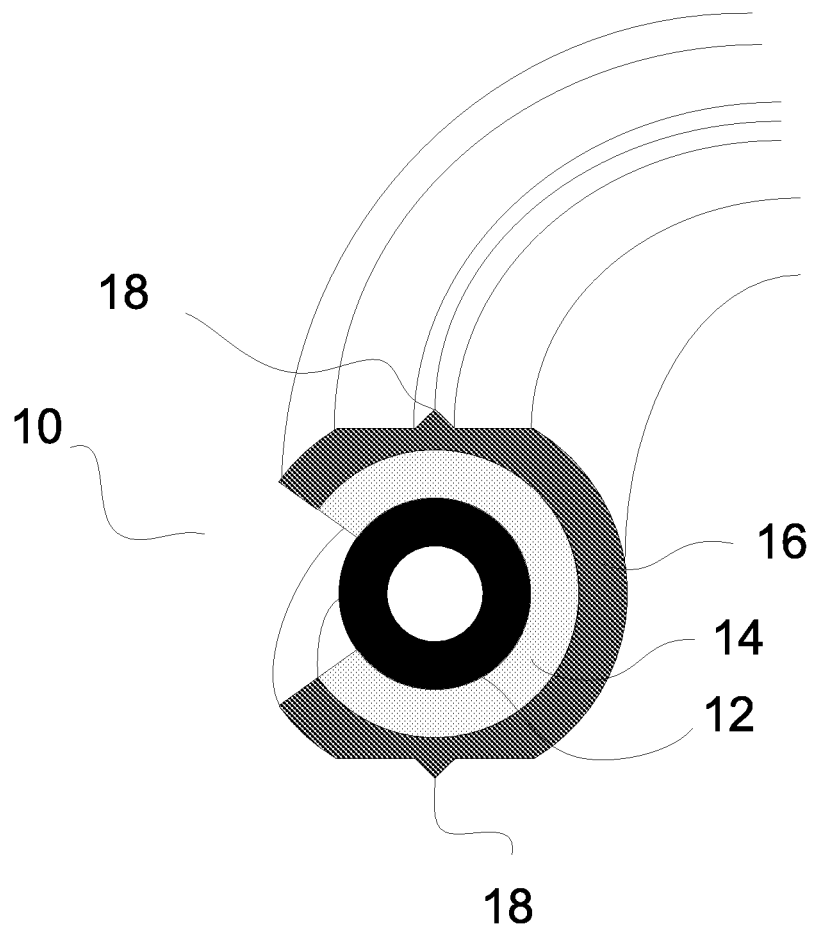
FIG. 6 is a representation of a metal seal shown in cross-section.

The metal seal or gasket preferably comprises an annular shaped seal having a cross section provided with an outer circumferential opening and formed in a laterally C-shape or U-shape. Referring to FIGS. 4 and 6, the metal seal 10 preferably comprises an outer metal jacket 16, an inner elastomeric material or spring 12, and a liner 14 positioned between said outer metal jacket 16 and said inner elastomeric material or spring 12. The metal seal is capable of sealing even with a low clamping pressure. The metal seal is typically a single-use seal but may be reusable. The metal seal or gasket can reduce the tightening force necessary for sealing of the container.

Figure 5:
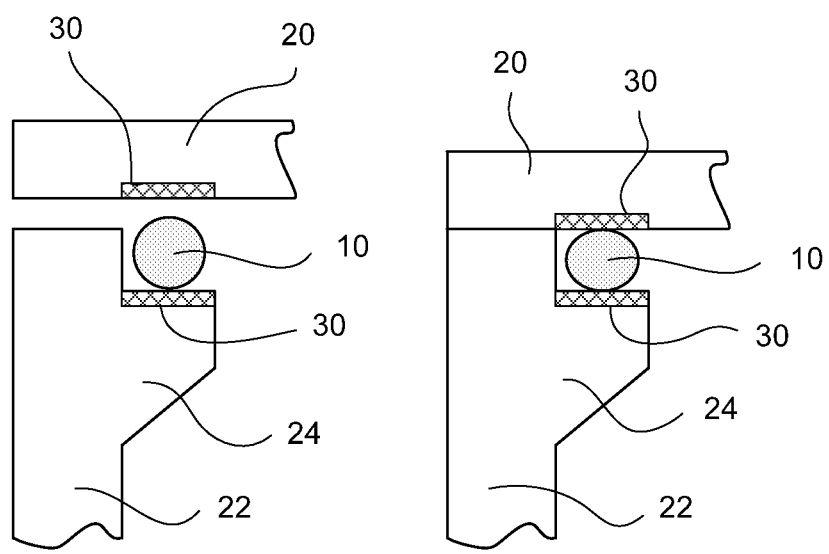
FIG. 5 is a schematic representation of a portion of a vapor or liquid phase reagent dispensing apparatus shown in cross-section.

Referring to FIGS. 4, 5 and 6, the outer metal jacket 16 preferably includes a projection 18 which is annularly formed at a top exterior surface and which abuts against the hardened flat surface 30 of the top wall member 20, and a projection 18 which is annularly formed at a bottom exterior surface and which abuts against the hardened flat surface 30 of the protuberance 24. The hardened opposing faces on the flat surfaces 30 of the top wall member 20 and the protuberance 24 both extend the useful life of the container and allow for a tighter seal.

A metal material such as stainless steel, inconel, and the like and materials obtained by plating or vapor depositing soft metal such as nickel and the like on the surfaces of metal materials can be generally used as a metal material used in the metal jacket. However, when the metal seal is used in a semiconductor application, it is preferable to use a single material of corrosion resistant austenite stainless steel such as 316L stainless steel and a twice or thrice vacuum melted material made of stainless steel, e.g., material that is melted and refined in vacuum twice or thrice to remove chemical components by which pollution is caused.

The outer metal jacket 16 is preferably made of stainless steel, i.e., the same material used in construction of the vessel. Other illustrative seals include, for example, elastomeric single use or reusable seals made from Viton®, or hard single use or reusable seals made from Teflon®. While some materials will form a leak tight seal, as measured by a helium leak test, the seals useful in this invention are impermeable to moisture and thereby do not cause degradation of moisture sensitive materials.

Illustrative elastomeric materials useful in the metal seals include, for example, (i) rubber such as natural rubber, ethylene propylene rubber, ethylene propylene diene rubber, acrylonitrile-butadiene rubber, hydrogenated acrylonitrile-butadiene rubber, styrene-butadiene rubber, silicone rubber, chloroprene rubber, chlorosulfonated polyethylene rubber, fluorine rubber, fluoridated silicone rubber, acrylic rubber, and ethylene acrylic rubber or its crosslinked rubber, and (ii) thermoplastic elastomers such as thermoplastic elastomers of the polystyrene system, thermoplastic elastomers of the polyolefin system, thermoplastic elastomers of the polyvinyl chloride system, and thermoplastic elastomers of the polyester system. See, for example, U.S. Pat. No. 6,357,759 B1.

Figure 7:
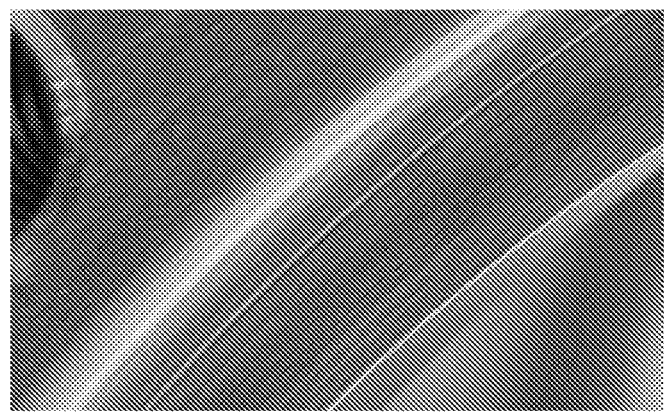
FIG. 7 is a photograph of a protuberance surface of an ampoule that has been damaged from a single delta metal seal. The protuberance surface was not hardened.
Figure 8:
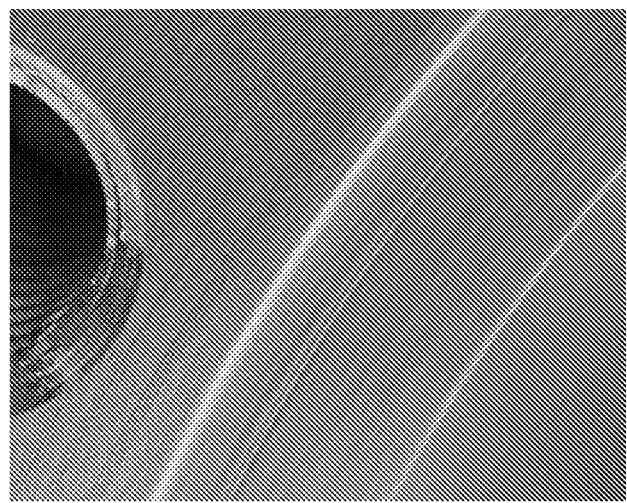
FIG. 8 is a photograph of a protuberance surface of an ampoule that has been damaged from two delta metal seals. The protuberance surface was not hardened.

The metal seals of this invention can be constructed of either an outer stainless steel, e.g., 316 stainless steel, or nickel jacket wrapped around an inner elastomeric material or spring. As shown in FIGS. 4 and 6, in cross section, a typical seal has a "C" shape with the opening of the C facing out. Compression of non-delta seals (i.e., those having a smooth round metal jacket with no projections) can result in telegraphing of the spring shape to both the opposing flat surfaces of the top wall member and the protuberance. Compression of the delta seal (i.e., those having projections on the top and bottom portions of the metal jacket) from a stainless steel jacket can impart a sharp line to an unhardened opposing flat surfaces of the top wall member and the protuberance from the delta or projection. See FIGS. 7 and 8 which show damage inflicted by a stainless steel delta C-ring when used in an ampoule without any treatment to harden the opposing flat surfaces of the top wall member and the protuberance.

In accordance with this invention, the size of the metal seal can be large enough so that a liner can be added to prevent telegraphing of the spring to the metal surfaces. Illustrative liners that can be used in the metal seals include, for example, those made of inconel, stainless steel alloy and the like. The liners provide stiffness to the metal seal. To further reduce the damage to the opposing flat surfaces of the top wall member and the protuberance, diamond burnishing can be applied to the surfaces to smooth the surfaces and work harden them.

The dimensions of the metal seal useful in this invention can vary widely. These dimensions allow the top wall member of the ampoule to sit squarely and completely butted on the sidewall member at the optimal seal compression while, at the same time, a leak tight seal can be formed between the hardened surfaces of the top wall member and the protuberance.

The preferred seals useful in this invention are made of metal and are generally not reusable. Garlock Industries produces a C-ring seal useful in this invention. See FIGS. 4 and 6. Preferred seals useful in this invention are constructed of an outer 316 stainless steel jacket wrapped around an inner spring. In cross section, the seal has a "C" shape with the opening of the C facing out. Since the ampoule or container is made of stainless steel, e.g., 316 stainless steel, this is the preferred material of construction to minimize any potential trace metal contamination produced by interaction of the high purity chemical with a non-316 stainless steel seal. Another concern could be galvanic corrosion between a non-stainless steel seal and the ampoule or container.

As shown in FIGS. 4 and 6, for ultra-high vacuum applications, the metal seal 10 can incorporate a projection 18, e.g., delta, into the top and bottom surfaces of the seal. This will focus the seal along the narrow ridge of the protuberance 24 and concentrate the seal force in the hardened areas 30 of the top wall member 20 and protuberance 24.

Compression of a 316 stainless steel delta seal can generate a tight seal on unhardened surfaces. Unfortunately, it can also impart a sharp groove to the unhardened top wall member and protuberance member from the delta cutting into the unhardened surfaces thereby shortening the useful life of the vessel or ampoule.

The two-part containers (ampoules) of this invention have hardened opposing flat surfaces of the top wall member and the protuberance extending into the internal vessel compartment adjacent to the top wall member. One illustrative hardening method involves burnishing the opposing faces of the top wall member and the protuberance. Another illustrative hardening method involves welding stellite into the opposing flat surfaces of the top wall member and the protuberance. Damage from the metal seal to the opposing flat surfaces of the top wall member and the protuberance can be prevented by these hardening methods. The hardened opposing faces facilitate extension of the useful life of the container and allow for a tighter seal.

The hardened opposing flat surfaces of the top wall member and the protuberance can be formed by burnishing said opposing flat sealing surfaces. The hardened opposing flat surfaces of the top wall member and the protuberance can also be formed by incorporating a hardening material into the opposing flat surfaces. An illustrative hardening material comprises Stellite.

In accordance with this invention, the sealing surfaces of both the top wall member and the protuberance are hardened. Hardening can be achieved in several ways. As an illustration, the sealing surfaces can be burnished or polished with a diamond tipped tool. This can increase the hardness between 1 and 200% of the initial value, preferably between 30-70%.

Another illustrative hardening technique involves the introduction of Stellite 4®, a weldable, hard tool grade metal into the opposing surfaces of the top wall member and the protuberance as shown in FIG. 5. A bead of Stellite® (Rockwell Hardness C=48 in which higher numbers indicate a harder surface) can be welded into both opposing surfaces of the top wall member and the protuberance and then ground down to produce a desired smooth surface. Use of either method along with a delta seal can result in a leak-tight, reusable container with no damage to the sealing surfaces.

Fastening means are used to secure the top wall member to the sidewall member through the opposing flat surfaces that are in contact with one another. Suitable fastening means include, for example, bolts. The number of bolts needed to secure the top wall member to the sidewall member is not narrowly critical and can range from about 2 to about 20 bolts, preferably from about 4 to about 16 bolts, and more preferably from about 8 to about 12 bolts. The bolts are tightened sufficient to give a helium leak rate of less than $9\times10^{-9}$ standard cubic centimeters per second, typically a tightening torque of about 0.1 Nm/piece. The metal seals used in this invention are constructed such that a satisfactory sealing property is obtained, even if it is used with a low clamping pressure.

A measure of a container's ability to seal (and reseal) is determined by a helium leak rate. A container which has a helium leak rate of less than $9\times10^{-9}$ atm-cc/sec (standard cubic centimeters per second) is highly desirable, less than $6\times10^{-9}$ atm-cc/sec (standard cubic centimeters per second) is preferred, and less than $3\times10^{-9}$ atm-cc/sec (standard cubic centimeters per second) is more preferred. While this value is easy to achieve for a one-part container, it has proven to be difficult to achieve for two-part containers where the cover can be removed from the base. Two-part containers are easier to clean, which is critical for delivering consistently high purity chemicals. As set forth herein, the design and construction of both the metal seal and the hardened opposing flat surfaces of the top wall member and the protuberance are important to a successful container.

The ampoule can include inlet and outlet valves to allow the chemicals to be delivered to the end use equipment. The material in the container is delivered either under vacuum, for low vapor pressure chemicals, or using an inert gas to sweep the vapors out. The material may alternatively be delivered as a liquid through a dip tube to the end use equipment where it can be vaporized or dispensed as needed.

The internal configuration of the ampoule or vessel has a small well or sump cavity that the source chemical level sensor and temperature sensor project down into. The cross sectional area of this sump cavity is substantially less than that of the main body of the vessel or ampoule which means the remaining volume when the source chemical level sensor trips is substantially less than what would be remaining in the main body of the ampoule. This effectively eliminates the dead space inherent in other level sensors such as ultrasonic or optical level sensors.

The sump cavity has been extended to include the temperature sensor, e.g., thermowell and thermocouple, so that the source chemical level sensor and temperature sensor are both at the same level. In this way, the temperature sensor is wet as long as the source chemical level sensor is wet. This is an important safety consideration. If the temperature sensor was dry while the source chemical level sensor indicated the presence of chemical, it could lead to heating of the ampoule to unsafe temperatures. The ampoule design of this invention ensures that the temperature sensor is still wet even after the source chemical level sensor indicates that the ampoule should be changed.

The temperature sensor is included in the ampoule to ensure uniform heat conduction. The source chemical level sensor is included in the ampoule to ensure efficient use of the source chemical. The valves and source chemical level sensor are attached via face seal connections to ensure a clean, leak proof seal. Once assembled in a clean room, the ampoule is conditioned to remove adsorbed water and leak checked with a helium leak detector. The ampoule is designed to be used at pressures from a few torr to slightly above ambient.

A trench machined into the bottom of the stainless steel ampoule provides the sump cavity that minimizes the amount of material necessary for the source chemical level sensor to detect. The trench also locates the source chemical level sensor and the temperature sensor in the same sump cavity so that both detectors are always wet. The floor of the ampoule can have a slope of 3 degrees toward a central point so that any remaining material is funneled into the trench, further minimizing chemical waste.

In one embodiment, the sump cavity is configured as a dual well structure in the bottom wall member of the vessel, with one well containing the lower extremity of the temperature sensor and the other well containing the lower end of the source chemical level sensor element.

The sump cavity may suitably occupy a minor fraction, e.g., 20% or less, of the cross-section floor surface area of the vessel, and be readily constructed by machining, milling, boring or routing of the floor member of the vessel.

The thermowell may be made from 0.375 inch tubing in order to accommodate a wide variety of thermocouples. A small amount of heat conducting oil will be placed in the thermowell to insure proper transmission of heat to the thermocouple. For the types of temperatures generally used in chemical vapor deposition, a K-type thermocouple is the most commonly used.

The dimensions of the trench should be deep enough to allow the source chemical level sensor to detect the fluid plus a small amount to allow clearance between the source chemical level sensor and the bottom of the trench. There should also be clearance around the temperature and source chemical level sensors themselves so that the sides of the trench do not interfere with the sensors. Approximately 0.125 inches of clearance is sufficient for most sensors. The temperature sensor should not contact the bottom or sides of the sump cavity and should be in non-interfering proximity therewith. The lower end of the temperature sensor should be located at the same or closer proximity to the sub-floor surface of the sump cavity in relation to the lower end of the source chemical level sensor.

The source chemical level sensor can be an ultrasonic type sensor. This sensor has a dead space of only 0.3 inches. The ultrasonic sensor also has a diameter of only 0.5 inches so that the diameter of the trench is minimized. Using these numbers and assuming a one liter ampoule, the ampoule can be configured such that the source chemical level sensor will signal the end of material when only 1% is remaining. Illustrative source chemical level sensors useful in this invention include, for example, ultrasonic sensors, optical sensors, capacitive sensors and float-type sensors.

Figure 12:
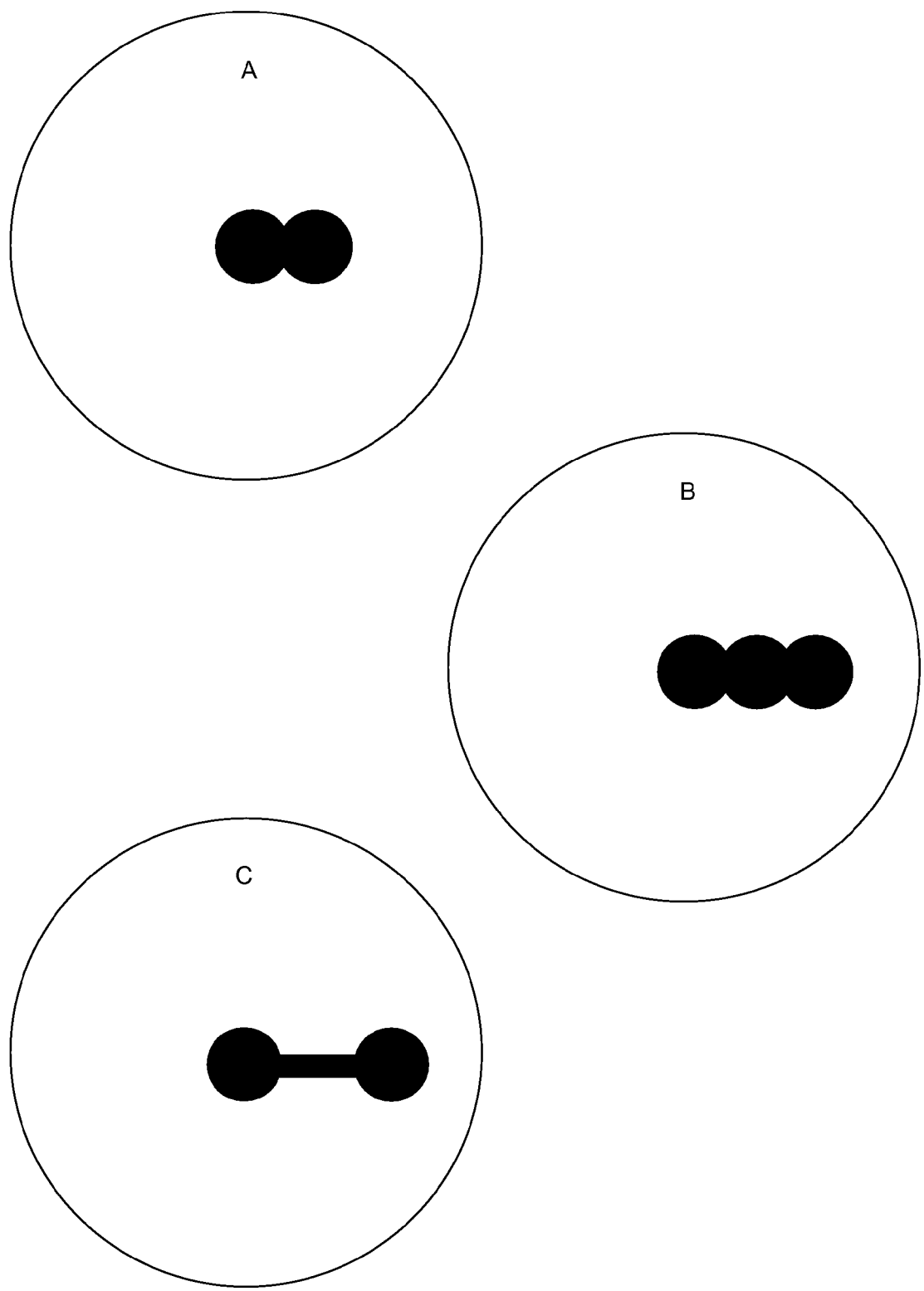
FIG. 12 is a top plan view of the bottom wall member surface of the vessel showing different configurations of the sump cavity.

Although a trench has been specified, in a case due to ease of machining, alternate geometries of the sump could be employed. As shown in FIG. 12A and FIG. 12B, two, three or more intersecting circular depressions or wells could serve as a sump cavity. Alternately, two, three or more circular depressions or wells joined by a connecting trench can serve as a sump cavity as shown in FIG. 12C. These configurations would allow for minimal cross sectional area and thus the least wasted material.

In preferred embodiments, the sump cavity of the vapor or liquid phase reagent dispensing apparatus of this invention may have a dumbbell shape in top plan view of the bottom wall member surface. The sump cavity may also comprise two or three transversely spaced-apart circular depressions or wells in source chemical flow communication with one another, with one of the circular depressions or wells having the lower end of the temperature sensor disposed therein and another of the circular depressions or wells having the lower end of the source chemical level sensor disposed therein. Further, the source chemical level sensor well may be connected to a temperature sensor well by a yoke passage, thereby defining a dumbbell conformation of the sump cavity.

The temperature sensor extends from an upper end exterior of the vessel through a portion of the top wall member and generally vertically downwardly into the interior volume of the vessel, with the lower end of the temperature sensor being located in non-interfering proximity to the surface of the bottom wall. The source chemical level sensor extends from an upper end exterior of the vessel through a portion of the top wall member and generally vertically downwardly into the interior volume of the vessel, with the lower end of the source chemical level sensor being located in non-interfering proximity to the surface of the bottom wall.

The temperature of the source chemical is monitored through the use of the temperature sensor, e.g., a thermocouple in a thermowell. The temperature sensor is operatively arranged in the vessel to determine the temperature of source chemical in the vessel, the source chemical level sensor is operatively arranged in the vessel to determine the level of source chemical in the vessel, the temperature sensor and source chemical level sensor are located in non-interfering proximity to each other in the vessel, with the lower end of the temperature sensor being located at the same or closer proximity to the surface of the vessel in relation to the lower end of the source chemical level sensor, and the temperature sensor and source chemical level sensor are in source chemical flow communication in the vessel. The source chemical level sensor is selected from ultrasonic sensors, optical sensors, capacitive sensors and float-type sensors, and said temperature sensor comprises a thermowell and thermocouple.

The bottom wall member provides a sump cavity in which the lower end of a temperature sensor, source chemical level sensor, dip tube and/or bubbler tube may be disposed. Such a configuration can permit a high percentage, e.g., 95% or greater, preferably 98% or greater, of the volume of the originally furnished liquid or solid source chemical to be utilized in the application for which the source chemical is selectively dispensed. This configuration can also improve the economics of the source chemical supply and dispensing system and processes in which the dispensed source chemical is employed.

This invention allows for a minimal amount of semiconductor precursor chemical to remain in the ampoule or bubbler when the source chemical level sensor has signaled the end of the contents. This is very important as the complexity and cost of semiconductor precursors rises. In order to minimize costs, semiconductor manufacturers will want to waste as little precursor as possible. In addition, this invention places the temperature sensor in the same recessed sump cavity as the source chemical level sensor. This ensures that the true temperature of the semiconductor precursor will be read as long as the source chemical level sensor indicates there is precursor present. This is important from a safety standpoint. If the temperature sensor was to be outside of the semiconductor precursor it would send a false low temperature signal to the heating apparatus. This could lead to the application of excessive heat to the ampoule which can cause an unsafe situation and decomposition of the semiconductor precursor.

Referring again to the vessel or ampoule, the vessel is equipped with a source chemical level sensor which extends from an upper portion exterior of the vessel, downwardly through a non-centrally located portion of the top wall member of the vessel, to a lower end, non-centrally located on the bottom floor member, in close proximity to the surface of the sump cavity of the vessel to permit utilization of at least 95% of source chemical reagent when source chemical reagent is contained in the vessel. The upper portion of the source chemical level sensor may be connected by a source chemical level sensing signal transmission line to a central processing unit, for transmission of sensed fill level signals from the source chemical level sensor to the central processing unit during operation of the system.

In a like manner, the vessel is equipped with a temperature sensor, i.e., a thermowell and thermocouple, which extends from an upper portion exterior of the vessel, downwardly through a centrally located portion of the top wall member of the vessel, to a lower end, centrally located on the bottom wall member, in close proximity to the surface of the sump cavity of the vessel. The upper portion of the temperature sensor may be connected by a temperature sensing signal transmission line to a central processing unit, for transmission of sensed temperature signals from the temperature sensor to the central processing unit during operation of the system.

The central processing unit, which may comprise a suitable microprocessor, computer, or other appropriate control means, may also be joined by a control signal transmission line to a flow control valve (e.g., via a suitable valve actuator element) to selectively adjust flow control valve and control the flow of carrier gas to the vessel. The central processing unit may also be joined by a control signal transmission line to a second flow control valve (e.g., via a suitable valve actuator element) to selectively adjust the flow control valve and control the discharge of vapor phase reagent from the vessel. For purposes of this invention, flow control valves shall include isolation valves, metering valves and the like.

The sump cavity may preferably occupy a minor portion of the cross-sectional floor area of the vessel. In general, a plan view cross-sectional area of the sump cavity is preferably less than about 25% of the total cross-sectional area of the bottom wall member, i.e., vessel floor, and more preferably less than about 15% of the total cross-sectional area of the bottom wall member. For example, the cross-sectional area of the sump cavity may be in the range of from about 5 to about 20% of the total cross-sectional area of the vessel (floor area). The sidewalls of the sump cavity may be sloped, straight or of any other geometry or orientation.

It will be appreciated that the conformation, including the shape, geometry and dimensions, of the sump cavity in the practice of this invention may be widely varied in practice.

For example, the sump cavity may comprise separate discrete interconnected wells for the respective temperature sensor and source chemical level sensor lower end portions. These wells should be communicated with one another by a passage extending through the bottom wall member of the vessel and communicating at respective ends with the wells in the vicinity of the sub-floor surfaces of the wells. Such interconnecting passage may for example be a generally horizontally extending passage, or it may for example comprise a U-shape or manometric-type passage between the respective wells of the bottom wall member of the vessel, or it may have any other suitable shape and configuration for the purpose of communicating the wells or constituent parts of the sump cavity.

The sump cavity may be formed in the bottom wall member by any suitable manufacturing method, including casting, molding, etching, machining (drilling, milling, electric arc machining, etc.), or any other method providing a cavity structure in the floor member which provides a liquid holding volume of reduced cross-sectional area in the lower portion of the interior volume of the vessel or ampoule, so that a given volume of liquid occupies a greater height than would be the case in an interior volume of uniform cross-sectional area over its entire vertical extent.

In addition to easier cleaning afforded by the two-part ampoules, this invention allows the semiconductor manufacturer to use the maximum amount of precursor while wasting very little before change-out of the ampoule. This minimizes waste and maximizes the return on the investment in the semiconductor precursor and specific application.

Figure 9:
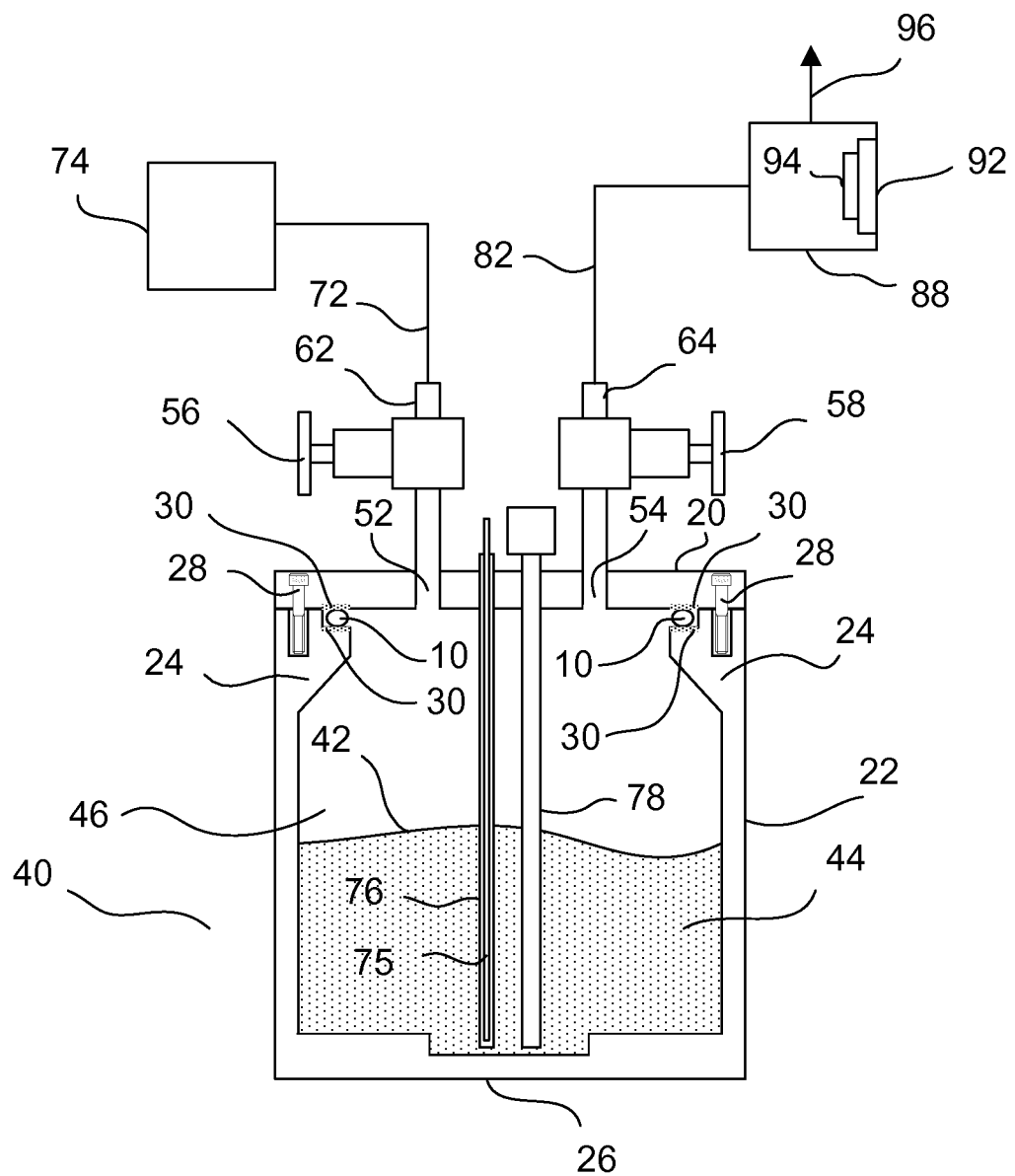
FIG. 9 is a schematic representation of a chemical vapor deposition system including a vapor phase reagent dispensing apparatus shown in elevation view and partial cross-section.
Figure 10:
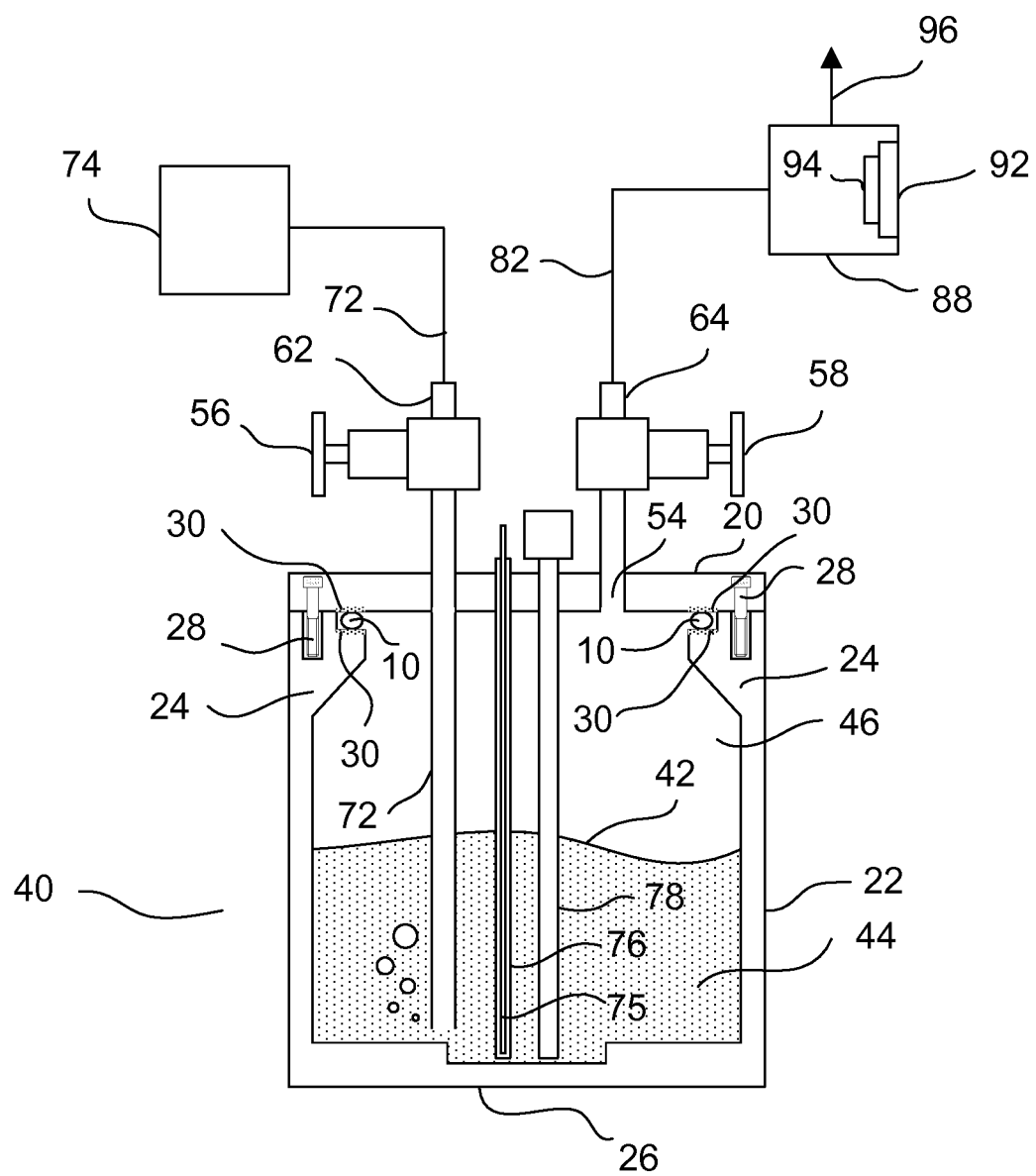
FIG. 10 is a schematic representation of a chemical vapor deposition system including a vapor phase reagent dispensing apparatus shown in elevation view and partial cross-section.
Figure 11:
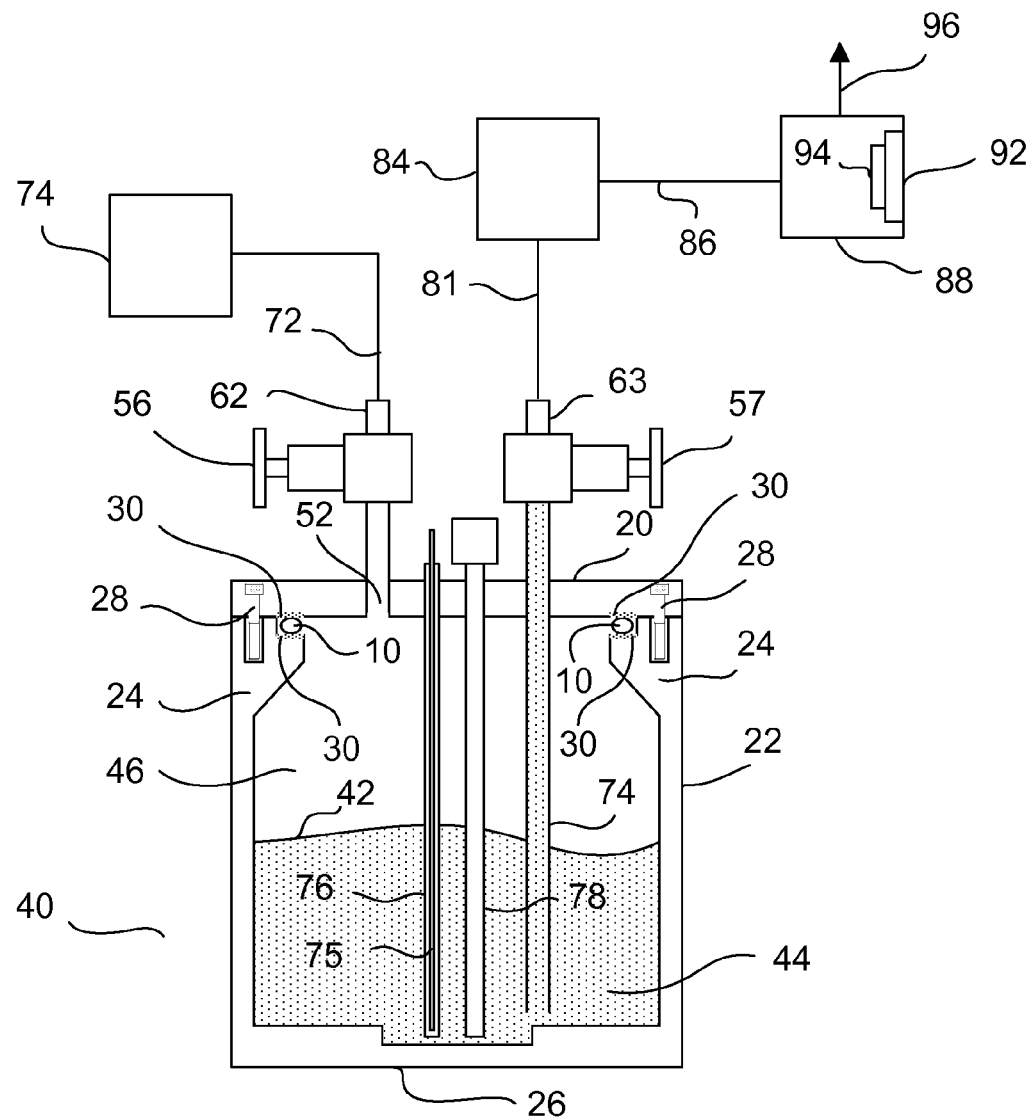
FIG. 11 is a schematic representation of a chemical vapor deposition system including a liquid phase reagent dispensing apparatus shown in elevation view and partial cross-section.

Referring to FIGS. 9, 10 and 11, the method to deliver 90% to 99% of a source chemical 44 that is a solid or liquid at room temperature comprises heating the source chemical 44 in the vessel 40 to a temperature above its melting point and preferably to a temperature appropriate for its use in a chemical vapor deposition or atomic layer deposition process, by providing heat from the side walls as well as the bottom of the vessel 40 or container, continuously monitoring both the temperature and the source chemical level in a sump cavity at the bottom of the container, adjusting the heat input to control the source chemical temperature below the lower of normal boiling point, boiling point at the container pressure, and decomposition temperature of the source chemical 44, passing an inert gas into the vessel 40 to mix with the vapor above the gas-liquid interface, and withdrawing the mixture of gas and vapor for delivery to a chemical vapor deposition or atomic layer deposition process.

The ampoule is installed on the chemical vapor deposition or atomic layer deposition tool by connecting to the two valves (56 and 57). The two valves (56 and 57) are isolation valves used during transport. Once installed on the tool, the valves are opened, the thermocouple 75 placed in the thermowell 76 and enough thermal conducting fluid is added to the thermowell 76 to cover the thermocouple 75. The ampoule is placed inside of a heating mantle, block or bath and brought up to delivery temperature. The temperature of the semiconductor precursor is monitored through the use of the thermocouple 75 in the thermowell 76. A carrier gas is introduced through the input 52 and passes through the headspace above the liquid-gas interface 46 which saturates it with the semiconductor precursor. The precursor saturated gas exits the ampoule through the outlet port 54 and is carried into the deposition tool 88. When the level of the source chemical goes below the ultrasonic transducer in the source chemical level sensor 78 it causes an alert signal to be sent. The signal can be audio, visual, logical or combinations thereof. The logic signal enables the source chemical level sensor 78 to communicate directly with the deposition tool 88.

As depicted in FIGS. 1, 2 and 3, a typical two-part ampoule consists of a vessel or cylinder of about five to six inches in diameter and five to seven inches in height and is constructed of 316 stainless steel (316SS). The top wall member is about a half of an inch thick and is attached by eight to twelve bolts to the sidewall member. The metal seal area is expanded in FIG. 5. The ampoule may or may not have an eductor (or dip) tube installed. A fill port may also be included. One valve may be used as an inlet for an inert gas to sweep the product out of the outlet valve. The ampoule may also have a bubbler tube. The bubbler tube can be used to bubble an inert gas through the product to assist in delivering the material as a vapor.

In an embodiment of this invention, all of the top wall member force can be directed to the metal seal. That is, the top wall member and the sidewall member may not touch. However, in such a configuration, it is possible that the top wall member could be bumped and dislodged enough to break the delicate seal between the C-ring and ampoule. Preferably, the top wall member and sidewall member are mated by tightening the bolts such that the seal only acts as a seal and is not involved in preventing movement between the top wall member and the sidewall member.

Illustrative source chemicals useful in this invention can vary over a wide range and include, for example, liquid or solid precursors for metals selected from ruthenium, hafnium, tantalum, molybdenum, platinum, gold, titanium, lead, palladium, zirconium, bismuth, strontium, barium, calcium, antimony and thallium, or precursors for metalloids selected from silicon and germanium. Preferred organometallic precursor compounds include ruthenium-containing, hafnium-containing, tantalum-containing and/or molybdenum-containing organometallic precursor compounds.

Solid source chemicals that sublime and solid source chemicals that melt upon heating can be used in this invention. For example, solid source chemicals that sublime can be used in the vapor phase reagent dispensing apparatus shown in FIGS. 1 and 2. Solid source chemicals that melt upon heating can be used in the vapor phase reagent dispensing apparatus shown in FIGS. 1 and 2 and the liquid phase reagent dispensing apparatus shown in FIG. 3. Likewise, liquid source chemicals can be used in the vapor phase reagent dispensing apparatus shown in FIGS. 1 and 2 and the liquid phase reagent dispensing apparatus shown in FIG. 3. When using solid source chemicals that sublime, it may be necessary to employ dust entrapment equipment.

Illustrative vapor or liquid phase reagents useful in this invention can vary over a wide range and include, for example, precursors for metals selected from ruthenium, hafnium, tantalum, molybdenum, platinum, gold, titanium, lead, palladium, zirconium, bismuth, strontium, barium, calcium, antimony and thallium, or precursors for a metalloids selected from silicon and germanium. Preferred organometallic precursor compounds include ruthenium-containing, hafnium-containing, tantalum-containing and/or molybdenum-containing organometallic precursor compounds.

Referring to FIG. 9, which is a schematic representation of a chemical vapor deposition system including a vapor phase reagent dispensing apparatus shown in elevation view and partial cross-section, the vapor phase reagent dispensing apparatus comprises a vessel 40 that includes a top wall member 20, a sidewall member 22 which may comprise a cylindrical wall or wall segments defining an enclosing sidewall structure, e.g., of square or other non-circular cross-section, and a bottom wall member 26. The top wall member 20, sidewall member 22 and bottom wall member 26 define an enclosed internal vessel compartment, which in operation may contain an inner gas volume 46 overlying a source chemical 44 defining a fill level 42 at a gas-liquid or gas-solid interface. The top wall member 20 and the sidewall member 22 have opposing flat surfaces that may or may not be in contact with one another.

The sidewall member 22 has a protuberance 24 that extends into the inner vessel compartment. The protuberance 24 is located adjacent to the top wall member 20. The top wall member 20 and the protuberance 24 have opposing flat surfaces that are not in contact with one another. At least a portion of the opposing flat surfaces of the top wall member 20 and the protuberance 24 are hardened. A metal seal 10 is aligned and in contact with the hardened opposing flat surfaces 30 of the top wall member 20 and the protuberance 24.

The bottom wall member 26 has a main floor surface containing a sump cavity. The sump cavity is bounded at its lower end by a sub-floor surface. At least a portion of the sump cavity is centrally located on the bottom wall member 26 and at least a portion of the sump cavity is non-centrally located on the bottom wall member 26.

A temperature sensor 75 (i.e., thermocouple) and 76 (i.e., thermowell) extends from an upper end exterior of the vessel 40 through a centrally located portion of the top wall member 20 and generally vertically downwardly through the inner gas volume 46 into the source chemical 44 to a lower end of that portion of the sump cavity centrally located on the bottom wall member 26. The lower end of temperature sensor 75 and 76 is located in non-interfering proximity to the sub-floor surface of the sump cavity.

A source chemical level sensor 78 extends from an upper end exterior of the vessel 40 through a non-centrally located portion of the top wall member 20 and generally vertically downwardly through the inner gas volume 46 into the source chemical 44 to a lower end of that portion of the sump cavity non-centrally located on the bottom wall member 26. The lower end of the source chemical level sensor is located in non-interfering proximity to the sub-floor surface of the sump cavity.

The temperature sensor 75 and 76 is operatively arranged in the sump cavity to determine the temperature of source chemical 44 in the vessel 40. The source chemical level sensor 78 is operatively arranged in the sump cavity to determine the level of source chemical 44 in the vessel 40. The temperature sensor 75 and 76 and source chemical level sensor 78 are located in non-interfering proximity to each other in the sump cavity. The lower end of the temperature sensor 75 and 76 is located at the same or closer proximity to the sub-floor surface of the sump cavity in relation to the lower end of the source chemical level sensor 78. The temperature sensor 75 and 76 and source chemical level sensor 78 are in source chemical flow communication in the sump cavity.

The vapor phase reagent dispensing apparatus is equipped with a carrier gas feed line 62 and 72 extending from the carrier gas feed inlet opening 52 upwardly and exteriorly from the top wall member 20 for delivery of carrier gas into said inner gas volume 46 above the fill level 42 to cause vapor of said source chemical 44 to become entrained in said carrier gas to produce vapor phase reagent. The carrier gas feed line 62 and 72 includes a carrier gas flow control valve 56 therein for control of flow of the carrier gas therethrough. The carrier gas feed line 62 and 72 is coupled to a carrier gas source 74. The carrier gas source 74 can be of any suitable type, for example, a high pressure gas cylinder, a cryogenic air separation plant, or a pressure swing air separation unit, furnishing a carrier gas, e.g., nitrogen, argon, helium, etc., to the carrier gas feed line 62 and 72.

The vapor phase reagent dispensing apparatus is also equipped with a vapor phase reagent discharge line 64 and 82 extending from the vapor phase reagent outlet opening 54 upwardly and exteriorly from the top wall member 20 for removal of vapor phase reagent from said inner gas volume 46 above the fill level 42. The vapor phase reagent discharge line 64 and 82 includes a vapor phase reagent flow control valve 58 therein for control of flow of the vapor phase reagent therethrough.

Referring to FIG. 9, the deposition chamber 88 can be a chemical vapor deposition chamber or an atomic layer deposition chamber. The vapor phase reagent discharge line 64 and 82 connects the vapor phase reagent dispensing apparatus to the deposition chamber 88. A heatable susceptor 92 is contained within the deposition chamber 88 and is located in a receiving relationship to the vapor phase reagent discharge line 64 and 82. An effluent discharge line 96 is connected to the deposition chamber 88. The vapor phase reagent passes through the vapor phase reagent discharge line 64 and 82 and into the deposition chamber 88, for contact with a substrate 94 on the heatable susceptor 92 and any remaining effluent is discharged through the effluent discharge line 96. The effluent may be passed to recycle, recovery, waste treatment, disposal, or other disposition means.

Referring to FIG. 9, this invention relates in part to a method for delivery of a vapor phase reagent to a deposition chamber comprising:

(b) providing a vapor phase reagent dispensing apparatus comprising:

a vessel 40 which comprises a removable top wall member 20, a sidewall member 22 and a bottom wall member 26 configured to form an internal vessel compartment to hold a source chemical 44 up to a fill level 42 and to additionally define an inner gas volume 46 above the fill level 42;

said sidewall member 22 having a protuberance 24 that extends into the internal vessel compartment adjacent to the top wall member 20;

said top wall member 20 and said sidewall member 22 having opposing flat surfaces, wherein the opposing flat surfaces are optionally in contact with one another;

fastening means 28 for securing said top wall member 20 to said sidewall member 22 through the opposing flat surfaces that are optionally in contact with one another;

said top wall member 20 and said protuberance 24 having opposing flat surfaces, wherein the opposing flat surfaces are not in contact with one another and at least a portion of the opposing flat surfaces are hardened 30;

a metal seal 10 aligned and in contact with the hardened opposing flat surfaces 30 of said top wall member 20 and said protuberance 24, wherein said hardened opposing flat surfaces 30 of said top wall member 20 and said protuberance 24 have a hardness greater than the hardness of said metal seal 10;

said bottom wall member 26 having a main floor surface containing a sump cavity therein extending downwardly from the main floor surface, the sump cavity being bounded at its lower end by a sub-floor surface, with at least a portion of the sump cavity being centrally located on the bottom wall member 26 and at least a portion of the sump cavity being non-centrally located on the bottom wall member 26;

a temperature sensor 75 (i.e., thermocouple) and 76 (i.e., thermowell) extending from an upper end exterior of the vessel 40 through a centrally located portion of the top wall member 20 and generally vertically downwardly through the inner gas volume 46 into the source chemical 44 to a lower end of that portion of the sump cavity centrally located on the bottom wall member 26, with the lower end of the temperature sensor 75 and 76 being located in non-interfering proximity to the sub-floor surface of the sump cavity;

a source chemical level sensor 78 extending from an upper end exterior of the vessel 40 through a non-centrally located portion of the top wall member 20 and generally vertically downwardly through the inner gas volume 46 into the source chemical 44 to a lower end of that portion of the sump cavity non-centrally located on the bottom wall member 26, with the lower end of the source chemical level sensor 78 being located in non-interfering proximity to the sub-floor surface of the sump cavity;

the temperature sensor 75 and 76 being operatively arranged in the sump cavity to determine the temperature of source chemical 44 in the vessel 40, the source chemical level sensor 78 being operatively arranged in the sump cavity to determine the level of source chemical 44 in the vessel 40, the temperature sensor 75 and 76 and source chemical level sensor 78 being located in non-interfering proximity to each other in the sump cavity, with the lower end of the temperature sensor 75 and 76 being located at the same or closer proximity to the sub-floor surface of the sump cavity in relation to the lower end of the source chemical level sensor 78, and the temperature sensor 75 and 76 and source chemical level sensor 78 being in source chemical flow communication in the sump cavity;

a non-centrally located portion of the top wall member 20 having a carrier gas feed inlet opening 52 through which carrier gas can be fed into said inner gas volume 46 above the fill level 42 to cause vapor of said source chemical 44 to become entrained in said carrier gas to produce vapor phase reagent;

a carrier gas feed line 62 and 72 extending from the carrier gas feed inlet opening 52 upwardly and exteriorly from the top wall member 20 for delivery of carrier gas into said inner gas volume 46 above the fill level 42, the carrier gas feed line 62 and 72 containing a carrier gas flow control valve 56 therein for control of flow of the carrier gas therethrough;

a non-centrally located portion of the top wall member 20 having a vapor phase reagent outlet opening 54 through which said vapor phase reagent can be dispensed from said apparatus; and a vapor phase reagent discharge line 64 and 82 extending from the vapor phase reagent outlet opening 54 upwardly and exteriorly from the top wall member 20 for removal of vapor phase reagent from said inner gas volume 46 above the fill level 42, the vapor phase reagent discharge line 64 and 82 containing a vapor phase reagent flow control valve 58 therein for control of flow of the vapor phase reagent therethrough;

adding source chemical 44 at ambient temperature to said vapor phase reagent dispensing apparatus;

heating the source chemical 44 in said vapor phase reagent dispensing apparatus to a temperature sufficient to vaporize the source chemical to provide vapor phase reagent;

feeding a carrier gas into said vapor phase reagent dispensing apparatus through said carrier gas feed line 62 and 72;

withdrawing the vapor phase reagent and carrier gas from said vapor phase reagent dispensing apparatus through said vapor phase reagent discharge line 64 and 82; and feeding the vapor phase reagent and carrier gas into said deposition chamber 88.

The method can further comprise:

contacting the vapor phase reagent with a substrate 94 on a heatable susceptor 92 within the deposition chamber 88; and discharging any remaining effluent through an effluent discharge line 96 connected to the deposition chamber 88.

In operation of the system depicted in FIG. 9, source chemical 44 is placed in the vessel 40 and heated to a temperature sufficient to vaporize the source chemical 44. Carrier gas is allowed to flow through the carrier gas feed line 62 and 72 to the carrier gas feed inlet opening 52 from which it is discharged into the inner gas volume 46 above the fill level 42. A carrier gas flow control valve 56 controls the flow of the carrier gas that is discharged into the inner gas volume 46. Vapor from the source chemical 44 becomes entrained in the carrier gas to produce vapor phase reagent.

The vapor phase reagent is discharged from the inner gas volume 46 through the vapor phase reagent outlet opening 54 and the vapor phase reagent discharge line 64 and 82. The vapor phase reagent is flowed in the vapor phase reagent discharge line 64 and 82 to the deposition chamber 88. A vapor phase reagent flow control valve 58 controls the flow of the vapor phase reagent that is flowed to the deposition chamber 88. In the deposition chamber 88, the vapor phase reagent is deposited onto the wafer or other substrate element 94 that is mounted on a heatable substrate 92 or other mount structure. Effluent vapor from the deposition chamber 88 is discharged in effluent discharge line 96. The effluent may be passed to recycle, recovery, waste treatment, disposal, or other disposition means.

During this operation, the fill level in the vessel 40 is detected by a source chemical level sensor 78. It is important to know when the source chemical 44 inside of the vessel 40 is close to running out so that it can be changed at the end of a chemical vapor deposition or atomic layer deposition cycle. The source chemical level progressively declines and eventually lowers into the sump cavity to a minimum head (height of source chemical in the sump cavity), at which point the central processing unit receives a corresponding sensed fill level signal by a fill level sensing signal transmission line. The central processing unit responsively transmits a control signal in a control signal transmission line to the carrier gas flow control valve to close the valve and shut off the flow of carrier gas to the vessel, and also concurrently transmits a control signal in a control signal transmission line to close the vapor phase reagent flow control valve, to shut off the flow of vapor phase reagent from the vessel.

Also, during this operation, the temperature of the source chemical 44 in vessel 40 is detected by a temperature sensor 75 and 76. It is important to monitor the temperature of the source chemical 44 inside of the vessel 40 to control the vapor pressure. If the temperature of the source chemical 44 in the vessel 40 becomes too high, the central processing unit receives a corresponding sensed temperature signal by a temperature sensing signal transmission line. The central processing unit responsively transmits a control signal in a control signal transmission line to a heating means to decrease the temperature.

The vapor phase reagent dispensing apparatus of this invention may be useful for vaporization of liquids and solid materials, e.g., liquid and solid source reagents used in chemical vapor deposition, atomic layer deposition and ion implantation processes. See, for example, U.S. Pat. No. 6,921,062 B2.

The vapor phase reagent dispensing apparatus and method for delivery of a vapor phase reagent to a deposition chamber, both described above, are embodiments of U.S. patent application Ser. No. 12/014,194, filed Jan. 15, 2008, and incorporated by reference herein.

In an embodiment depicted in FIG. 10, which is a schematic representation of a chemical vapor deposition system including a vapor phase reagent dispensing apparatus shown in elevation view and partial cross-section, the vapor phase reagent dispensing apparatus further comprises a portion of the top wall member 20 having a carrier gas feed inlet opening comprising a bubbler tube 72 that extends through the inner gas volume 46 into the source chemical 44 and through which said carrier gas can be bubbled into the source chemical 44 to cause at least a portion of source chemical vapor to become entrained in said carrier gas to produce a flow of vapor phase reagent to said inner gas volume 46 above the fill level 42, said bubbler tube 72 having an inlet end adjacent to the top wall member 20 and an outlet end adjacent to the bottom wall member 26; and a portion of the top wall member 20 having a vapor phase reagent outlet opening 54 through which said vapor phase reagent can be dispensed from said apparatus.

Referring to FIG. 10, the vapor phase reagent dispensing apparatus comprises a vessel 40 that includes a top wall member 20, a sidewall member 22 which may comprise a cylindrical wall or wall segments defining an enclosing sidewall structure, e.g., of square or other non-circular cross-section, and a bottom wall member 26. The top wall member 20, sidewall member 22 and bottom wall member 26 define an enclosed internal vessel compartment, which in operation may contain an inner gas volume 46 overlying a source chemical 44 defining a fill level 42 at a gas-liquid or gas-solid interface. The top wall member 20 and the sidewall member 22 have opposing flat surfaces that may or may not be in contact with one another.

The sidewall member 22 has a protuberance 24 that extends into the inner vessel compartment. The protuberance 24 is located adjacent to the top wall member 20. The top wall member 20 and the protuberance 24 have opposing flat surfaces that are not in contact with one another. At least a portion of the opposing flat surfaces of the top wall member 20 and the protuberance 24 are hardened. A metal seal 10 is aligned and in contact with the hardened opposing flat surfaces 30 of the top wall member 20 and the protuberance 24.

The bottom wall member 26 has a main floor surface containing a sump cavity. The sump cavity is bounded at its lower end by a sub-floor surface. At least a portion of the sump cavity is centrally located on the bottom wall member 26 and at least a portion of the sump cavity is non-centrally located on the bottom wall member 26.

A temperature sensor 75 (i.e., thermocouple) and 76 (i.e., thermowell) extends from an upper end exterior of the vessel 40 through a centrally located portion of the top wall member 20 and generally vertically downwardly through the inner gas volume 46 into the source chemical 44 to a lower end of that portion of the sump cavity centrally located on the bottom wall member 26. The lower end of temperature sensor 75 and 76 is located in non-interfering proximity to the sub-floor surface of the sump cavity.

A source chemical level sensor 78 extends from an upper end exterior of the vessel 40 through a non-centrally located portion of the top wall member 20 and generally vertically downwardly through the inner gas volume 46 into the source chemical 44 to a lower end of that portion of the sump cavity non-centrally located on the bottom wall member 26. The lower end of the source chemical level sensor is located in non-interfering proximity to the sub-floor surface of the sump cavity.

The temperature sensor 75 and 76 is operatively arranged in the sump cavity to determine the temperature of source chemical 44 in the vessel 40. The source chemical level sensor 78 is operatively arranged in the sump cavity to determine the level of source chemical 44 in the vessel 40. The temperature sensor 75 and 76 and source chemical level sensor 78 are located in non-interfering proximity to each other in the sump cavity. The lower end of the temperature sensor 75 and 76 is located at the same or closer proximity to the sub-floor surface of the sump cavity in relation to the lower end of the source chemical level sensor 78. The temperature sensor 75 and 76 and source chemical level sensor 78 are in source chemical flow communication in the sump cavity.

The vapor phase reagent dispensing apparatus is equipped with a carrier gas feed line 62 and 72 extending from the carrier gas feed inlet opening upwardly and exteriorly from the top wall member 20 and with a bubbler tube 72 that extends through the inner gas volume 46 into the source chemical 44 for delivery of carrier gas into said source chemical 44 to cause vapor of said source chemical 44 to become entrained in said carrier gas to produce vapor phase reagent. The bubbler tube 72 has an inlet end adjacent to the top wall member 20 and an outlet end adjacent to the bottom wall member 26. The carrier gas feed line 62 and 72 includes a carrier gas flow control valve 56 therein for control of flow of the carrier gas therethrough. The carrier gas feed line 62 and 72 is coupled to a carrier gas source 74. The carrier gas source 74 can be of any suitable type, for example, a high pressure gas cylinder, a cryogenic air separation plant, or a pressure swing air separation unit, furnishing a carrier gas, e.g., nitrogen, argon, helium, etc., to the carrier gas feed line 62 and 72.

The vapor phase reagent dispensing apparatus is also equipped with a vapor phase reagent discharge line 64 and 82 extending from the vapor phase reagent outlet opening 54 upwardly and exteriorly from the top wall member 20 for removal of vapor phase reagent from said inner gas volume 46 above the fill level 42. The vapor phase reagent discharge line 64 and 82 includes a vapor phase reagent flow control valve 58 therein for control of flow of the vapor phase reagent therethrough.

Referring to FIG. 10, the deposition chamber 88 can be a chemical vapor deposition chamber or an atomic layer deposition chamber. The vapor phase reagent discharge line 64 and 82 connects the vapor phase reagent dispensing apparatus to the deposition chamber 88. A heatable susceptor 92 is contained within the deposition chamber 88 and is located in a receiving relationship to the vapor phase reagent discharge line 64 and 82. An effluent discharge line 96 is connected to the deposition chamber 88. The vapor phase reagent passes through the vapor phase reagent discharge line 64 and 82 and into the deposition chamber 88, for contact with a substrate 94 on the heatable susceptor 92 and any remaining effluent is discharged through the effluent discharge line 96. The effluent may be passed to recycle, recovery, waste treatment, disposal, or other disposition means.

Referring to FIG. 10, this invention relates in part to a method for delivery of a vapor phase reagent to a deposition chamber comprising:

(c) providing a vapor phase reagent dispensing apparatus comprising:

a vessel 40 which comprises a removable top wall member 20, a sidewall member 22 and a bottom wall member 26 configured to form an internal vessel compartment to hold a source chemical 44 up to a fill level 42 and to additionally define an inner gas volume 46 above the fill level 42;

said sidewall member 22 having a protuberance 24 that extends into the internal vessel compartment adjacent to the top wall member 20;

said top wall member 20 and said sidewall member 22 having opposing flat surfaces, wherein the opposing flat surfaces are optionally in contact with one another;

fastening means 28 for securing said top wall member 20 to said sidewall member 22 through the opposing flat surfaces that are optionally in contact with one another;

said top wall member 20 and said protuberance 24 having opposing flat surfaces, wherein the opposing flat surfaces are not in contact with one another and at least a portion of the opposing flat surfaces are hardened;

a metal seal 10 aligned and in contact with the hardened opposing flat surfaces 30 of said top wall member 20 and said protuberance 24, wherein said hardened opposing flat surfaces 30 of said top wall member 20 and said protuberance 24 have a hardness greater than the hardness of said metal seal 10;

said bottom wall member 26 having a main floor surface containing a sump cavity therein extending downwardly from the main floor surface, the sump cavity being bounded at its lower end by a sub-floor surface, with at least a portion of the sump cavity being centrally located on the bottom wall member 26 and at least a portion of the sump cavity being non-centrally located on the bottom wall member 26;

a temperature sensor 75 (i.e., thermocouple) and 76 (i.e., thermowell) extending from an upper end exterior of the vessel 40 through a centrally located portion of the top wall member 20 and generally vertically downwardly through the inner gas volume 46 into the source chemical 44 to a lower end of that portion of the sump cavity centrally located on the bottom wall member 26, with the lower end of the temperature sensor 75 and 76 being located in non-interfering proximity to the sub-floor surface of the sump cavity;

a source chemical level sensor 78 extending from an upper end exterior of the vessel 40 through a non-centrally located portion of the top wall member 20 and generally vertically downwardly through the inner gas volume 46 into the source chemical 44 to a lower end of that portion of the sump cavity non-centrally located on the bottom wall member 26, with the lower end of the source chemical level sensor 78 being located in non-interfering proximity to the sub-floor surface of the sump cavity;

the temperature sensor 75 and 76 being operatively arranged in the sump cavity to determine the temperature of source chemical 44 in the vessel 40, the source chemical level sensor 78 being operatively arranged in the sump cavity to determine the level of source chemical 44 in the vessel 40, the temperature sensor 75 and 76 and source chemical level sensor 78 being located in non-interfering proximity to each other in the sump cavity, with the lower end of the temperature sensor 75 and 76 being located at the same or closer proximity to the sub-floor surface of the sump cavity in relation to the lower end of the source chemical level sensor 78, and the temperature sensor 75 and 76 and source chemical level sensor 78 being in source chemical flow communication in the sump cavity;

a non-centrally located portion of the top wall member 20 having a carrier gas feed inlet opening comprising a bubbler tube 72 that extends through the inner gas volume 46 into the source chemical 44 and through which said carrier gas can be bubbled into the source chemical 44 to cause at least a portion of source chemical vapor to become entrained in said carrier gas to produce a flow of vapor phase reagent to said inner gas volume 46 above the fill level 42, said bubbler tube 72 having an inlet end adjacent to the top wall member 20 and an outlet end adjacent to the bottom wall member 26;

a carrier gas feed line 62 and 72 extending from the carrier gas feed inlet opening upwardly and exteriorly from the top wall member 20 for delivery of carrier gas into said source chemical 44, the carrier gas feed line 62 and 72 containing a carrier gas flow control valve 56 therein for control of flow of the carrier gas therethrough;

a non-centrally located portion of the top wall member 20 having a vapor phase reagent outlet opening 54 through which said vapor phase reagent can be dispensed from said apparatus; and a vapor phase reagent discharge line 64 and 82 extending from the vapor phase reagent outlet opening 54 upwardly and exteriorly from the top wall member 20 for removal of vapor phase reagent from said inner gas volume 46 above the fill level 42, the vapor phase reagent discharge line 64 and 82 containing a vapor phase reagent flow control valve 58 therein for control of flow of the vapor phase reagent therethrough;

adding source chemical 44 at ambient temperature to said vapor phase reagent dispensing apparatus;

heating the source chemical 44 in said vapor phase reagent dispensing apparatus to a temperature sufficient to vaporize the source chemical 44 to provide vapor phase reagent;

feeding a carrier gas into said vapor phase reagent dispensing apparatus through said carrier gas feed line 62 and 72;

withdrawing the vapor phase reagent and carrier gas from said vapor phase reagent dispensing apparatus through said vapor phase reagent discharge line 64 and 82; and feeding the vapor phase reagent and carrier gas into said deposition chamber 88.

The method can further comprise:

contacting the vapor phase reagent with a substrate 94 on a heatable susceptor 92 within the deposition chamber 88; and discharging any remaining effluent through an effluent discharge line 96 connected to the deposition chamber 88.

In operation of the system depicted in FIG. 10, source chemical 44 is placed in the vessel 40 and heated to a temperature sufficient to vaporize the source chemical 44. Carrier gas is allowed to flow through the carrier gas feed line 62 and 72 to the carrier gas feed inlet opening and through bubbler tube 72 from which it is bubbled into the source chemical 44. A carrier gas flow control valve 56 controls the flow of the carrier gas that is discharged into the source chemical 44. Vapor from the source chemical 44 becomes entrained in the carrier gas to produce vapor phase reagent.

The vapor phase reagent is discharged from the inner gas volume 46 through the vapor phase reagent outlet opening 54 and the vapor phase reagent discharge line 64 and 82. The vapor phase reagent is flowed in the vapor phase reagent discharge line 64 and 82 to the deposition chamber 88. A vapor phase reagent flow control valve 58 controls the flow of the vapor phase reagent that is flowed to the deposition chamber 88. In the deposition chamber 88, the vapor phase reagent is deposited onto the wafer or other substrate element 94 that is mounted on a heatable substrate 92 or other mount structure. Effluent vapor from the deposition chamber 88 is discharged in effluent discharge line 96. The effluent may be passed to recycle, recovery, waste treatment, disposal, or other disposition means.

During this operation, the fill level in the vessel 40 is detected by a source chemical level sensor 78. It is important to know when the source chemical 44 inside of the vessel 40 is close to running out so that it can be changed at the end of a chemical vapor deposition or atomic layer deposition cycle. The source chemical level progressively declines and eventually lowers into the sump cavity to a minimum head (height of source chemical in the sump cavity), at which point the central processing unit receives a corresponding sensed fill level signal by a fill level sensing signal transmission line. The central processing unit responsively transmits a control signal in a control signal transmission line to the carrier gas flow control valve to close the valve and shut off the flow of carrier gas to the vessel, and also concurrently transmits a control signal in a control signal transmission line to close the vapor phase reagent flow control valve, to shut off the flow of vapor phase reagent from the vessel.

Also, during this operation, the temperature of the source chemical 44 in vessel 40 is detected by a temperature sensor 75 and 76. It is important to monitor the temperature of the source chemical 44 inside of the vessel 40 to control the vapor pressure. If the temperature of the source chemical 44 in the vessel 40 becomes too high, the central processing unit receives a corresponding sensed temperature signal by a temperature sensing signal transmission line. The central processing unit responsively transmits a control signal in a control signal transmission line to a heating means to decrease the temperature.

The vapor phase reagent dispensing apparatus, i.e., bubbler, of this invention may be useful for vaporization of liquids and solid materials, e.g., liquid and solid source reagents used in chemical vapor deposition, atomic layer deposition and ion implantation processes. See, for example, U.S. Pat. No. 7,077,388 B2.

In an embodiment depicted in FIG. 11, which is a schematic representation of a chemical vapor deposition system including a vapor phase reagent dispensing apparatus shown in elevation view and partial cross-section, the liquid phase reagent dispensing apparatus further comprises a portion of the top wall member 20 having an inert gas feed inlet opening 52 through which said inert gas can be fed into the inner gas volume 46 above the fill level 42 to pressurize the inner gas volume above the fill level 42; and a portion of the top wall member 20 having a liquid phase reagent outlet opening comprising a diptube 74 that extends through the inner gas volume 46 into the source chemical 44 and through which liquid phase reagent can be dispensed from said apparatus, said diptube 74 having an outlet end adjacent to the top wall member 20 and an inlet end adjacent to the bottom wall member 26.

Referring to FIG. 11, the liquid phase reagent dispensing apparatus comprises a vessel 40 that includes a top wall member 20, a sidewall member 22 which may comprise a cylindrical wall or wall segments defining an enclosing sidewall structure, e.g., of square or other non-circular cross-section, and a bottom wall member 26. The top wall member 20, sidewall member 22 and bottom wall member 26 define an enclosed internal vessel compartment, which in operation may contain an inner gas volume 46 overlying a source chemical 44 defining a fill level 42 at a gas-liquid or gas-solid interface. The top wall member 20 and the sidewall member 22 have opposing flat surfaces that may or may not be in contact with one another.

The sidewall member 22 has a protuberance 24 that extends into the inner vessel compartment. The protuberance 24 is located adjacent to the top wall member 20. The top wall member 20 and the protuberance 24 have opposing flat surfaces that are not in contact with one another. At least a portion of the opposing flat surfaces of the top wall member 20 and the protuberance 24 are hardened. A metal seal 10 is aligned and in contact with the hardened opposing flat surfaces 30 of the top wall member 20 and the protuberance 24.

The bottom wall member 26 has a main floor surface containing a sump cavity. The sump cavity is bounded at its lower end by a sub-floor surface. At least a portion of the sump cavity is centrally located on the bottom wall member 26 and at least a portion of the sump cavity is non-centrally located on the bottom wall member 26.

A temperature sensor 75 (i.e., thermocouple) and 76 (i.e., thermowell) extends from an upper end exterior of the vessel 40 through a centrally located portion of the top wall member 20 and generally vertically downwardly through the inner gas volume 46 into the source chemical 44 to a lower end of that portion of the sump cavity centrally located on the bottom wall member 26. The lower end of temperature sensor 75 and 76 is located in non-interfering proximity to the sub-floor surface of the sump cavity.

A source chemical level sensor 78 extends from an upper end exterior of the vessel 40 through a non-centrally located portion of the top wall member 20 and generally vertically downwardly through the inner gas volume 46 into the source chemical 44 to a lower end of that portion of the sump cavity non-centrally located on the bottom wall member 26. The lower end of the source chemical level sensor 78 is located in non-interfering proximity to the sub-floor surface of the sump cavity.

The temperature sensor 75 and 76 is operatively arranged in the sump cavity to determine the temperature of source chemical 44 in the vessel 40. The source chemical level sensor 78 is operatively arranged in the sump cavity to determine the level of source chemical 44 in the vessel 40. The temperature sensor 75 and 76 and source chemical level sensor 78 are located in non-interfering proximity to each other in the sump cavity. The lower end of the temperature sensor 75 and 76 is located at the same or closer proximity to the sub-floor surface of the sump cavity in relation to the lower end of the source chemical level sensor 78. The temperature sensor 75 and 76 and source chemical level sensor 78 are in source chemical flow communication in the sump cavity.

The liquid phase reagent dispensing apparatus is equipped with an inert gas feed line 62 and 72 extending from the inert gas feed inlet opening 52 upwardly and exteriorly from the top wall member 20 for delivery of inert gas into said inner gas volume 46 above the fill level 42 to pressurize the inner gas volume 46 above the fill level 42. The inert gas feed line 62 and 72 includes an inert gas flow control valve 56 therein for control of flow of the inert gas therethrough. The inert gas feed line 62 and 82 is coupled to an inert gas source 74. The inert gas source 74 can be of any suitable type, for example, a high pressure gas cylinder, a cryogenic air separation plant, or a pressure swing air separation unit, furnishing an inert gas, e.g., nitrogen, argon, helium, etc., to the inert gas feed line 62 and 72.

The vapor phase reagent dispensing apparatus is also equipped with a diptube 74 that extends through the inner gas volume 46 into the source chemical 44 and through which liquid phase reagent can be dispensed from said apparatus. The diptube 74 has an outlet end adjacent to the top wall member 20 and an inlet end adjacent to the bottom wall member 26.

The liquid phase reagent dispensing apparatus is also equipped with a liquid phase reagent discharge line 63 and 81 extending from the liquid phase reagent outlet opening (e.g., diptube 74) upwardly and exteriorly from the top wall member 20 for removal of liquid phase reagent from said vessel 40. The liquid phase reagent discharge line 63 and 81 includes a liquid phase reagent flow control valve 57 therein for control of flow of the liquid phase reagent therethrough.

Referring to FIG. 11, the deposition chamber 88 can be a chemical vapor deposition chamber or an atomic layer deposition chamber. The liquid phase reagent discharge line 63 and 81 connects the liquid phase reagent dispensing apparatus to a vaporization apparatus 84. The vaporization apparatus 84 has a carrier gas feed line (not shown in FIG. 11) extending from the carrier gas feed inlet opening (not shown in FIG. 11) upwardly and exteriorly from the vaporization apparatus 84 through which carrier gas can be fed into the vaporization apparatus 84 to cause vapor of said liquid phase reagent to become entrained in the carrier gas to produce vapor phase reagent. The carrier gas feed line contains a carrier gas flow control valve (not shown in FIG. 11) for control of flow of the carrier gas therethrough. The carrier gas feed line is coupled to a carrier gas source (not shown in FIG. 11). The carrier gas source can be of any suitable type, for example, a high pressure gas cylinder, a cryogenic air separation plant, or a pressure swing air separation unit, furnishing a carrier gas, e.g., nitrogen, argon, helium, etc., to the carrier gas feed line.

The vaporization apparatus 84 has a vapor phase reagent discharge line 86 extending from the vapor phase reagent outlet opening upwardly and exteriorly from the vaporization apparatus 84 through which the vapor phase reagent can be dispensed from the vaporization apparatus 84 to the deposition chamber 88. The vapor phase reagent discharge line 86 contains a vapor phase reagent flow control valve (not shown in FIG. 11) therein for control of flow of the vapor phase reagent therethrough.

A heatable susceptor 92 is contained within the deposition chamber 88 and is located in a receiving relationship to the vapor phase reagent discharge line 86. An effluent discharge line 96 is connected to the deposition chamber 88. The vapor phase reagent passes through the vapor phase reagent discharge line 86 and into the deposition chamber 88, for contact with a substrate 94 on the heatable susceptor 92 and any remaining effluent is discharged through the effluent discharge line 96. The effluent may be passed to recycle, recovery, waste treatment, disposal, or other disposition means.

Referring to FIG. 11, this invention relates in part to a method for delivery of a vapor phase reagent to a deposition chamber comprising:

(d) providing a liquid phase reagent dispensing apparatus comprising:

a vessel 40 which comprises a removable top wall member 20, a sidewall member 22 and a bottom wall member 26 configured to form an internal vessel compartment to hold a source chemical 44 up to a fill level 42 and to additionally define an inner gas volume 46 above the fill level 42;

said sidewall member 22 having a protuberance 24 that extends into the internal vessel compartment adjacent to the top wall member 20;

said top wall member 20 and said sidewall member 22 having opposing flat surfaces, wherein the opposing flat surfaces are optionally in contact with one another;

fastening means 28 for securing said top wall member 20 to said sidewall member 22 through the opposing flat surfaces that are optionally in contact with one another;

said top wall member 20 and said protuberance 24 having opposing flat surfaces, wherein the opposing flat surfaces are not in contact with one another and at least a portion of the opposing flat surfaces are hardened;

a metal seal 10 aligned and in contact with the hardened opposing flat surfaces 30 of said top wall member 20 and said protuberance 24, wherein said hardened opposing flat surfaces 30 of said top wall member 20 and said protuberance 24 have a hardness greater than the hardness of said metal seal 10;

said bottom wall member 26 having a main floor surface containing a sump cavity therein extending downwardly from the main floor surface, the sump cavity being bounded at its lower end by a sub-floor surface, with at least a portion of the sump cavity being centrally located on the bottom wall member 26 and at least a portion of the sump cavity being non-centrally located on the bottom wall member 26;

a temperature sensor 75 (i.e., thermocouple) and 76 (i.e., thermowell) extending from an upper end exterior of the vessel 40 through a centrally located portion of the top wall member 20 and generally vertically downwardly through the inner gas volume 46 into the source chemical 44 to a lower end of that portion of the sump cavity centrally located on the bottom wall member 26, with the lower end of the temperature sensor 75 and 76 being located in non-interfering proximity to the sub-floor surface of the sump cavity;

a source chemical level sensor 78 extending from an upper end exterior of the vessel 40 through a non-centrally located portion of the top wall member 20 and generally vertically downwardly through the inner gas volume 46 into the source chemical 44 to a lower end of that portion of the sump cavity non-centrally located on the bottom wall member 26, with the lower end of the source chemical level sensor 78 being located in non-interfering proximity to the sub-floor surface of the sump cavity;

the temperature sensor 75 and 76 being operatively arranged in the sump cavity to determine the temperature of source chemical 44 in the vessel 40, the source chemical level sensor 78 being operatively arranged in the sump cavity to determine the level of source chemical 44 in the vessel 40, the temperature sensor 75 and 76 and source chemical level sensor 78 being located in non-interfering proximity to each other in the sump cavity, with the lower end of the temperature sensor 75 and 76 being located at the same or closer proximity to the sub-floor surface of the sump cavity in relation to the lower end of the source chemical level sensor 78, and the temperature sensor 75 and 76 and source chemical level sensor 78 being in source chemical flow communication in the sump cavity;

a non-centrally located portion of the top wall member 20 having an inert gas feed inlet opening 52 through which said inert gas can be fed into the inner gas volume 46 above the fill level 42 to pressurize the inner gas volume 46 above the fill level 42;

an inert gas feed line 62 and 72 extending from the inert gas feed inlet opening 52 upwardly and exteriorly from the top wall member 20 for delivery of inert gas into said inner gas volume 46 above the fill level 42, the carrier gas feed line 62 and 72 containing an inert gas flow control valve 56 therein for control of flow of the inert gas therethrough;

a non-centrally located portion of the top wall member 20 having a liquid phase reagent outlet opening comprising a diptube 74 that extends through the inner gas volume 46 into the source chemical 44 and through which liquid phase reagent can be dispensed from said apparatus, said diptube 74 having an outlet end adjacent to the top wall member 20 and an inlet end adjacent to the bottom wall member 26; and a liquid phase reagent discharge line 63 and 81 extending from the liquid phase reagent outlet opening upwardly and exteriorly from the top wall member 20 for removal of liquid phase reagent from said vessel 40, the liquid phase reagent discharge line 63 and 81 containing a liquid phase reagent flow control valve 57 therein for control of flow of the liquid phase reagent therethrough;

adding liquid phase reagent at ambient temperature to said liquid phase reagent dispensing apparatus;

optionally heating a solid source chemical in said liquid phase reagent dispensing apparatus to a temperature sufficient to melt the solid source chemical to provide liquid phase reagent;

feeding an inert gas into said liquid phase reagent dispensing apparatus through said inert gas feed line 62 and 72;

withdrawing the liquid phase reagent from said liquid phase reagent dispensing apparatus through said diptube 74 and said liquid phase reagent discharge line 63 and 81;

providing a vaporization apparatus 84 comprising:

a vessel which comprises a top wall member, a sidewall member and a bottom wall member configured to form an internal vessel compartment to vaporize the liquid phase reagent;

said liquid phase reagent discharge line 63 and 81 connecting the liquid phase reagent dispensing apparatus to said vaporization apparatus 84;

a portion of the vaporization apparatus 84 having a carrier gas feed inlet opening through which carrier gas can be fed into said vaporization apparatus 84 to cause vapor of said liquid phase reagent to become entrained in said carrier gas to produce vapor phase reagent;

a portion of the vaporization apparatus 84 having a vapor phase reagent outlet opening through which said vapor phase reagent can be dispensed from said vaporization apparatus 84;

a carrier gas feed line extending from the carrier gas feed inlet opening upwardly and exteriorly from the vaporization apparatus for delivery of carrier gas into said vaporization apparatus 84, the carrier gas feed line containing a carrier gas flow control valve therein for control of flow of the carrier gas therethrough;

a vapor phase reagent discharge line 86 extending from the vapor phase reagent outlet opening upwardly and exteriorly from the vaporization apparatus 84 for removal of vapor phase reagent from said vaporization apparatus 84 to said deposition chamber 88, the vapor phase reagent discharge line 86 containing a vapor phase reagent flow control valve therein for control of flow of the vapor phase reagent therethrough;

feeding the liquid phase reagent into said vaporization apparatus 84;

heating the liquid phase reagent in said vaporization apparatus 84 to a temperature sufficient to vaporize the liquid phase reagent to provide said vapor phase reagent;

feeding a carrier gas into said vaporization apparatus 84 through said carrier gas feed line;

withdrawing the vapor phase reagent and carrier gas from said vaporization apparatus through said vapor phase reagent discharge line 86; and feeding the vapor phase reagent and carrier gas into said deposition chamber 88.

The method can further comprise:

contacting the vapor phase reagent with a substrate 94 on a heatable susceptor 92 within the deposition chamber 88; and discharging any remaining effluent through an effluent discharge line 96 connected to the deposition chamber 88.

In an illustrative operation of the system depicted in FIG. 11, source chemical 44 is placed in the vessel 40 and an inert gas is allowed to flow through the inert gas feed line 62 and 72 to the inert gas feed inlet opening 52 and into the inner gas volume 46 above the liquid fill level 42 to pressurize the inner gas volume 46 above the liquid fill level 42. An inert gas flow control valve 56 controls the flow of the inert gas that is discharged into the inner gas volume 46 above the liquid fill level 42.

The liquid phase reagent is discharged from the vessel 40 through liquid phase reagent outlet opening (e.g., diptube 74) and the liquid phase reagent discharge line 63 and 81. The liquid phase reagent is flowed in the liquid phase reagent discharge line 63 and 81 to the deposition chamber 88. A liquid phase reagent flow control valve 57 controls the flow of the liquid phase reagent that is flowed to the vaporization apparatus 84.

In vaporization apparatus 84, the liquid phase reagent is vaporized to form a source vapor for the subsequent vapor deposition operation. The vaporization apparatus 84 may also receive a carrier gas for combining with or shrouding the source vapor produced by vaporization of the liquid phase reagent. Alternatively, the source vapor may be passed to the downstream vapor deposition operation in neat form. In any event, the source vapor from vaporization apparatus 84 is flowed through vapor phase reagent discharge line 86 to deposition chamber 88. In the deposition chamber 88, the vapor phase reagent is deposited onto the wafer or other substrate element 94 that is mounted on a heatable substrate 92 or other mount structure. Effluent vapor from the deposition chamber 88 is discharged in effluent discharge line 96. The effluent may be passed to recycle, recovery, waste treatment, disposal, or other disposition means.

During this operation, the fill level in the vessel 40 is detected by a source chemical level sensor 78. It is important to know when the source chemical 44 inside of the vessel 40 is close to running out so that it can be changed at the end of a chemical vapor deposition or atomic layer deposition cycle. The source chemical level progressively declines and eventually lowers into the sump cavity to a minimum head (height of source chemical in the sump cavity), at which point the central processing unit receives a corresponding sensed fill level signal by a fill level sensing signal transmission line. The central processing unit responsively transmits a control signal in a control signal transmission line to the carrier gas flow control valve to close the valve and shut off the flow of carrier gas to the vessel, and also concurrently transmits a control signal in a control signal transmission line to close the liquid phase reagent flow control valve, to shut off the flow of liquid reagent from the vessel.

Also, during this operation, the temperature of the source chemical 44 in vessel 40 is detected by a temperature sensor 75 and 76. It is important to monitor the temperature of the source chemical 44 inside of the vessel 40 to control the vapor pressure. If the temperature of the source chemical 44 in the vessel 40 becomes too high, the central processing unit receives a corresponding sensed temperature signal by a temperature sensing signal transmission line. The central processing unit responsively transmits a control signal in a control signal transmission line to a heating means to decrease the temperature.

The liquid phase reagent dispensing apparatus of this invention may be useful for dispensing of reagents such as precursors used in chemical vapor deposition, atomic layer deposition and ion implantation processes, and can achieve a high level of withdrawal of liquid reagent from the vessel. See, for example, U.S. Pat. No. 6,077,356.

The liquid phase reagent dispensing apparatus, i.e., diptube, and method for delivery of a vapor phase reagent to a deposition chamber, both described above, are embodiments of U.S. patent application Ser. No. 12/014,237, filed Jan. 15, 2008, and incorporated by reference herein.

In an embodiment of this invention, an organometallic compound is employed in vapor or liquid phase deposition techniques for forming powders, films or coatings. The compound can be employed as a single source precursor or can be used together with one or more other precursors, for instance, with vapor generated by heating at least one other organometallic compound or metal complex.

During the deposition process, it is generally necessary to heat the vessel or ampoule by some means in order to increase the vapor pressure of the source chemical precursor and thus increase the amount of chemical in the carrier gas. It is important to monitor the temperature of the source chemical precursor inside of the ampoule to control the vapor pressure. This monitoring of the temperature of the semiconductor precursor can be accomplished by means of a thermocouple in the thermowell. As the semiconductor precursor is consumed, it will take less heat input to keep it at the target temperature. The heat source for the ampoule will need to be monitored by the thermocouple and the temperature of a heating block, mantle or bath adjusted accordingly.

It is necessary for the thermowell to be at a distance from the floor of the sump cavity such that it is still immersed in the source chemical semiconductor precursor when the source chemical level sensor indicates the end of the source chemical. The temperature sensor should not contact the bottom or sides of the sump cavity and should be in non-interfering proximity therewith. One way to ensure this is to make the source chemical level sensor and the thermowell project the same distance down from the ampoule cover or top wall member. The lower end of the temperature sensor should be located at the same or closer proximity to the sub-floor surface of the sump cavity in relation to the lower end of the source chemical level sensor. This configuration takes advantage of the dead space on the level sensing device to ensure that the thermowell is always wet. This is important not only as a safety consideration, but it also ensures that the precursor temperature does not exceed the decomposition temperature.

The system described is for a vessel or ampoule with both a source chemical level sensor and a temperature sensor. It may be possible to combine a source chemical level sensor and a thermocouple into one probe. In that case, a singular circular depression would be the only sump needed. It is also possible that an ampoule would not need to be heated, thus obviating the need for a temperature sensor. In such a case, a singular circular depression would be the only sump cavity needed.

A solid insert could be devised to create a sump cavity in order to modify an existing ampoule. The insert would have to be permanently attached to the ampoule by welding or some other method in order to prevent movement of the insert during shipping and ensure that the trench lined up with the source chemical level sensor and temperature sensor.

The system can be used with an ultrasonic level sensor. An optical level sensor could be used but may require a deeper well. A magnetic float type of sensor could also be used but may require a larger diameter sump cavity to accommodate the diameter of the magnetic float.

While only an end point source chemical level sensor with only one detection point has been discussed, it is possible to use a multipoint or continuous source chemical level sensor and monitor the consumption of source chemical semiconductor precursor as it is being used. It is necessary to ensure that the last point of detection is inside of the well to get the benefit of the invention.

The system described herein is for use with a thermowell and thermocouple. It will be appreciated that other types of temperature sensing devices may be used in the practice of this invention and may be widely varied in practice.

The system described herein is for an ampoule with both a source chemical level sensor and a temperature sensor. As a result of this, the trench has been designed to handle two tubular probes. This system could also be used with a tube attached to the carrier gas feed inlet opening, thus turning the ampoule into a bubbler. It may be desirable to have the inlet tube extend down into the sump cavity as well so as to maximize the path length of the bubble. This will maximize the amount of dissolved chemical in the bubbler and make the bubbler more efficient. If a bubbler tube is added, a third cavity may need to be added to the sump cavity or the trench may need to be extended.

Deposition can be conducted in the presence of other vapor phase components. In an embodiment of the invention, film deposition is conducted in the presence of at least one non-reactive carrier gas. Examples of non-reactive gases include inert gases, e.g., nitrogen, argon, helium, as well as other gases that do not react with the organometallic compound precursor under process conditions. In other embodiments, film deposition is conducted in the presence of at least one reactive gas. Some of the reactive gases that can be employed include but are not limited to hydrazine, oxygen, hydrogen, air, oxygen-enriched air, ozone ($O_3$), nitrous oxide ($N_2O$), water vapor, organic vapors, ammonia and others. As known in the art, the presence of an oxidizing gas, such as, for example, air, oxygen, oxygen-enriched air, $O_3$, $N_2O$ or a vapor of an oxidizing organic compound, favors the formation of a metal oxide film.

Deposition methods described herein can be conducted to form a film, powder or coating that includes a single metal or a film, powder or coating that includes a single metal oxide. Mixed films, powders or coatings also can be deposited, for instance mixed metal oxide films. A mixed metal oxide film can be formed, for example, by employing several organometallic precursors, at least one of which being selected from the organometallic compounds described above.

Vapor phase film deposition can be conducted to form film layers of a desired thickness, for example, in the range of from less than 1 nm to over 1 mm. The precursors described herein are particularly useful for producing thin films, e.g., films having a thickness in the range of from about 10 nm to about 100 nm. Films of this invention, for instance, can be considered for fabricating metal electrodes, in particular as n-channel metal electrodes in logic, as capacitor electrodes for DRAM applications, and as dielectric materials.

The deposition method also is suited for preparing layered films, wherein at least two of the layers differ in phase or composition. Examples of layered film include metal-insulator-semiconductor, and metal-insulator-metal.

The organometallic compound precursors can be employed in atomic layer deposition, chemical vapor deposition or, more specifically, in metalorganic chemical vapor deposition processes known in the art. For instance, the organometallic compound precursors described above can be used in atmospheric, as well as in low pressure, chemical vapor deposition processes. The compounds can be employed in hot wall chemical vapor deposition, a method in which the entire reaction chamber is heated, as well as in cold or warm wall type chemical vapor deposition, a technique in which only the substrate is being heated.

The organometallic compound precursors described above also can be used in plasma or photo-assisted chemical vapor deposition processes, in which the energy from a plasma or electromagnetic energy, respectively, is used to activate the chemical vapor deposition precursor. The compounds also can be employed in ion-beam, electron-beam assisted chemical vapor deposition processes in which, respectively, an ion beam or electron beam is directed to the substrate to supply energy for decomposing a chemical vapor deposition precursor. Laser-assisted chemical vapor deposition processes, in which laser light is directed to the substrate to affect photolytic reactions of the chemical vapor deposition precursor, also can be used.

The deposition method can be conducted in various chemical vapor deposition reactors, such as, for instance, hot or cold-wall reactors, plasma-assisted, beam-assisted or laser-assisted reactors, as known in the art.

Illustrative substrates useful in the deposition chamber include, for example, materials selected from a metal, a metal silicide, a semiconductor, an insulator and a barrier material. A preferred substrate is a patterned wafer. Examples of substrates that can be coated employing the deposition method include solid substrates such as metal substrates, e.g., Al, Ni, Ti, Co, Pt, Ta; metal silicides, e.g., $TiSi_2$, $CoSi_2$, $NiSi_2$; semiconductor materials, e.g., Si, SiGe, GaAs, InP, diamond, GaN, SiC; insulators, e.g., $SiO_2$, $Si_3N_4$, $HfO_2$, $Ta_2O_5$, $Al_2O_3$, barium strontium titanate (BST) barrier materials, e.g., TiN, TaN; or on substrates that include combinations of materials. In addition, films or coatings can be formed on glass, ceramics, plastics, thermoset polymeric materials, and on other coatings or film layers. In a preferred embodiment, film deposition is on a substrate used in the manufacture or processing of electronic components. In other embodiments, a substrate is employed to support a low resistivity conductor deposit that is stable in the presence of an oxidizer at high temperature or an optically transmitting film.

The deposition method can be conducted to deposit a film on a substrate that has a smooth, flat surface. In an embodiment, the method is conducted to deposit a film on a substrate used in wafer manufacturing or processing. For instance, the method can be conducted to deposit a film on patterned substrates that include features such as trenches, holes or vias. Furthermore, the deposition method also can be integrated with other steps in wafer manufacturing or processing, e.g., masking, etching and others.

Chemical vapor deposition films can be deposited to a desired thickness. For example, films formed can be less than 1 micron thick, preferably less than 500 nanometers and more preferably less than 200 nanometers thick. Films that are less than 50 nanometers thick, for instance, films that have a thickness between about 0.1 and about 20 nanometers, also can be produced.

Organometallic compound precursors described above also can be employed in the method of the invention to form films by atomic layer deposition or atomic layer nucleation techniques, during which a substrate is exposed to alternate pulses of precursor, oxidizer and inert gas streams. Sequential layer deposition techniques are described, for example, in U.S. Pat. No. 6,287,965 and in U.S. Pat. No. 6,342,277. The disclosures of both patents are incorporated herein by reference in their entirety.

For example, in one atomic layer deposition cycle, a substrate is exposed, in step-wise manner, to: a) an inert gas; b) inert gas carrying precursor vapor; c) inert gas; and d) oxidizer, alone or together with inert gas. In general, each step can be as short as the equipment will permit (e.g. milliseconds) and as long as the process requires (e.g. several seconds or minutes). The duration of one cycle can be as short as milliseconds and as long as minutes. The cycle is repeated over a period that can range from a few minutes to hours. Film produced can be a few nanometers thin or thicker, e.g., 1 millimeter (mm).

The means and method of this invention thus achieves a substantial advance in the art, in the provision of a system for supply and dispensing of a vapor or liquid phase reagent, which permits 95-98% of the volume of the originally furnished source chemical to be utilized in the application for which the vapor or liquid phase reagent is selectively dispensed. The ease of cleaning of the two-part ampoule allows for re-use of these ampoules beyond what may be attained with the one-part ampoules.

Correspondingly, in operations such as the manufacture of semiconductor and superconductor products, it is possible with the means and method of this invention to reduce the waste of the source chemical to levels as low as 2-5% of the volume originally loaded into the dispensing vessel, and to re-use the ampoules many times over.

Accordingly, the practice of this invention markedly improves the economics of the source chemical supply and vapor or liquid phase reagent dispensing system, and the process in which the dispensed vapor or liquid phase reagent is employed. The invention in some instances may permit the cost-effective utilization of source chemicals which were as a practical matter precluded by the waste levels characteristic of prior art practice.

As a further benefit of this invention, the reduced source chemical inventory in the vessel at the end of the vapor or liquid phase reagent dispensing operation permits the switch-over time, during which the exhausted supply vessel is changed out from the process system, and replaced with another vessel for further processing, to be minimized as a result of the greater on-stream time for the supply vessel owing to increased usage of the originally charged liquid therefrom, relative to such prior practice.

Various modifications and variations of this invention will be obvious to a worker skilled in the art and it is to be understood that such modifications and variations are to be included within the purview of this application and the spirit and scope of the claims.

Example 1

Preparation of Top Wall Member and Protuberance Surfaces

As depicted in FIG. 5, the opposing sealing surfaces of the top wall member and the protuberance incorporate Stellite and can cover the full width of the top wall member and protuberance sealing areas. The sealing surfaces are then polished to a finish of 10-100 RMS, preferable 15 RMS.

Example 2

Preparation of Top Wall Member and Protuberance Surfaces

In this example, the opposing sealing surfaces of the top wall member and the protuberance are polished using a diamond tip burnishing tool to both work harden the stainless steel, i.e., 316 stainless steel, and produce the desired surface roughness of 15 RMS.

Example 3

Chemical Vapor Deposition Using Tetrakis(dimethylamino)hafnium (TDMAH)

An ampoule similar to that depicted in FIG. 1 is filled approximately ¾ full with TDMAH. TDMAH is a solid at ambient temperature and melts at approximately 29° C. A source chemical level sensor can be used that is a single point optical type that works by internal reflection of a light source when the sensor is in contact with a liquid. When no liquid is present, there is no internal reflection. The source chemical level sensor sends a signal when the TDMAH precursor content of the ampoule passes the end of the sensor.

The level sensor can be mounted thru a ¾ inch face seal connection. The temperature sensor can be a K type thermocouple in an all welded thermowell located in the center of the ampoule cover. The thermowell can be filled with a high temperature, heat conducting oil to ensure contact between the temperature sensor and the thermowell. The ends of the thermowell and level sensor extend into the internal vessel compartment near the bottom wall member of the ampoule. The seal between the opposing flat surfaces of the top wall member and the protuberance is depicted in FIG. 5. The carrier gas is nitrogen. The pressure of the gas is from 1 mTorr to 1000 Torr.

A suitable delivery temperature for TDMAH is between 40° C. and 100° C. Once the temperature sensor indicates that the ampoule has reached delivery temperature, the valves are opened allowing the carrier gas to enter the ampoule and a TDMAH precursor/carrier gas mixture to exit the ampoule. The TDMAH precursor/carrier gas mixture travels through tubing, is heated to between 10 to 20 degrees hotter than the ampoule to prevent condensation of the TDMAH precursor within the connecting lines, to the chemical vapor deposition chamber. Inside the chemical vapor deposition chamber is a 300 mm silicon wafer that has been previously modified (e.g., patterned, etched, doped, etc.). The wafer is heated to between 200° C. and 700° C. Inside the chemical vapor deposition chamber, the precursor mixture comes into contact with oxygen at the surface of the wafer and hafnium oxide begins to grow. The wafer is exposed for a time between a few seconds and a few minutes to allow for growth of the oxide film to the desired thickness before gas flow is terminated.

Example 4

Atomic Layer Deposition Using Tetrakis(diethylamino)hafnium (TDEAH)

An ampoule similar to that depicted in FIG. 1 is filled approximately ¾ full with TDEAH. TDEAH is a liquid at ambient temperature. A source chemical level sensor can be used that is a four point ultrasonic type that works by comparing the sonic conductance of a liquid to a gas. The source chemical level sensor sends a different signal when the TDEAH precursor content of the ampoule reaches any of four preset points with the last point being the end of the sensor. In this way the consumption rate of TDEAH precursor within the ampoule is monitored during use thereof. This monitoring allows for better planning of ampoule change out and gives the semiconductor manufacturer additional data about the process.

The level sensor can be mounted thru a ¾ inch face seal connection. The temperature sensor can be a K type thermocouple in an all welded thermowell located in the center of the ampoule cover. The thermowell can be filled with a high temperature, heat conducting oil to ensure contact between the temperature sensor and the thermowell. The ends of the thermowell and level sensor extend into the internal vessel compartment near the bottom wall of the ampoule. The seal between the opposing flat surfaces of the top wall member and the protuberance is depicted in FIG. 5. The carrier gas is nitrogen. The pressure of the gas is from 1 mTorr to 1000 Torr.

A suitable delivery temperature for TDEAH is between 80° C. and 120° C. Once the temperature sensor indicates that the ampoule has reached the appropriate delivery temperature, the valves are opened allowing the carrier gas to enter the ampoule and a TDEAH precursor/carrier gas mixture to exit the ampoule. At this point, another valve controls the delivery of the TDEAH precursor/carrier gas mixture to an atomic layer deposition chamber. The valve and the connecting tubing are heated to between 10 to 20 degrees hotter than the ampoule to prevent condensation of TDEAH precursor within the connecting lines, to the atomic layer deposition chamber. Inside the atomic layer deposition chamber is a 300 mm silicon wafer heated to between 200° C. and 700° C. that has been previously modified (e.g. patterned, etched, doped, etc.). The precursor deposits on the surface of the wafer in the atomic layer deposition chamber. Once sufficient time has passed for a complete monolayer to form on the surface of the wafer, usually a few seconds, the flow of TDEAH precursor/carrier gas mixture is interrupted and the chamber is purged with nitrogen. Oxygen is then introduced to the atomic layer deposition chamber and allowed to react with the TDEAH precursor on the surface of the wafer forming an oxide. Once the reaction is complete, nitrogen is used to purge the chamber and the process is repeated with a new charge of TDEAH precursor/carrier gas. The process is repeated depending on how many layers of oxide are needed. Typical repetitions are from tens of cycles to hundreds of cycles.

Example 5

Helium Leak Testing of Ampoules

A measure of a container's ability to seal (and reseal) is determined by a helium leak rate.

For an unfilled or empty container (e.g., ampoule) testing procedure, a clean, dry, empty container is attached to the helium leak detector, such as a Varian Model 979. Vacuum is applied to a value in the range of $1 \times 10^{-2}$ torr to $1 \times 10^{-4}$ torr, preferably $1 \times 10^{-4}$ torr to $9 \times 10^{-4}$ torr. The unit is set to measure a leak rate under vacuum, which is sometimes referred to as "outside-in" leak detection. A source of helium gas is then applied around all the potential leak points, both welded joints and mechanical seals (e.g., face seals) while the leak rate is observed on the read-out. An acceptable leak rate is in the range of $1 \times 10^{-6}$ atm-cc/sec to $1 \times 10^{-11}$ atm-cc/sec, preferably in the range of $1 \times 10^{-9}$ to $1 \times 10^{-10}$ atm-cc/sec (standard cubic centimeters per second).

For a filled container (e.g., ampoule) testing procedure, the container is filled with a precursor. Helium gas is added until the internal pressure is in the range of 1 psig to 30 psig, preferably about 5 psig, and all valves are closed tight. The ampoule is tested for leaks by setting the Varian Model 979 to sniffer mode. This is sometimes referred to as "inside-out" leak detection. The Varian Model 979 is operated in sniffer mode and all of the potential leak points, both welded joints and mechanical seals (e.g., face seals), are tested, with special attention for the fittings which are opened during filling of the ampoule. The leak rate is observed on the read-out. An acceptable leak rate is in the range of $1 \times 10^{-6}$ atm-cc/sec to $1 \times 10^{-8}$ atm-cc/sec, preferably in the range of $1 \times 10^{-8}$ to $9 \times 10^{-8}$ atm-cc/sec (standard cubic centimeters per second).

Ampoules similar to the one depicted in FIG. 1, with burnished opposing flat surfaces of the top wall member and the protuberance, were tested for helium leak rates by both the unfilled ampoule and filled ampoule testing procedures above. The results are set forth below.

| Helium Leak Rates | |
| --- | --- |
| Unfilled Ampoule | Filled Ampoule |
| $6 \times 10^{-9}$ atm-cc/sec | $2.4 \times 10^{-8}$ atm-cc/sec |
| $2.4 \times 10^{-8}$ atm-cc/sec | $2.3 \times 10^{-8}$ atm-cc/sec |
| $2.1 \times 10^{-9}$ atm-cc/sec | $4.2 \times 10^{-8}$ atm-cc/sec |
| $4.9 \times 10^{-10}$ atm-cc/sec | $5.6 \times 10^{-8}$ atm-cc/sec |
| $1 \times 10^{-10}$ atm-cc/sec | $3.8 \times 10^{-8}$ atm-cc/sec |
| $7.4 \times 10^{-10}$ atm-cc/sec | $2.7 \times 10^{-8}$ atm-cc/sec |
| $1 \times 10^{-10}$ atm-cc/sec | $3.6 \times 10^{-8}$ atm-cc/sec |
| $1 \times 10^{-10}$ atm-cc/sec | $2.6 \times 10^{-8}$ atm-cc/sec |
| $8.1 \times 10^{-10}$ atm-cc/sec | $2 \times 10^{-8}$ atm-cc/sec |
| $1 \times 10^{-10}$ atm-cc/sec | $2.6 \times 10^{-8}$ atm-cc/sec |
| $1.4 \times 10^{-9}$ atm-cc/sec | $2.8 \times 10^{-8}$ atm-cc/sec |
| $1.7 \times 10^{-10}$ atm-cc/sec | $4.7 \times 10^{-8}$ atm-cc/sec |

Ampoules similar to the one depicted in FIG. 1, with Stellite incorporated into the opposing flat surfaces of the top wall member and the protuberance, were tested for helium leak rates by both the unfilled ampoule and filled ampoule testing procedures above. The results are set forth below.

| Helium Leak Rates | |
| --- | --- |
| Unfilled Ampoule | Filled Ampoule |
| $1 \times 10^{-10}$ atm-cc/sec | $8 \times 10^{-9}$ atm-cc/sec |
| $6.5 \times 10^{-9}$ atm-cc/sec | $1.7 \times 10^{-8}$ atm-cc/sec |

While it has been shown and described what is considered to be certain embodiments of the invention, it will, of course, be understood that various modifications and changes in form or detail can readily be made without departing from the spirit and scope of the invention. It is, therefore, intended that this invention not be limited to the exact form and detail herein shown and described, nor to anything less than the whole of the invention herein disclosed and hereinafter claimed.

The invention claimed is:

1. A vapor phase reagent dispensing apparatus comprising:
a vessel which comprises a removable top wall member, a sidewall member and a bottom wall member configured to form an internal vessel compartment to hold a source chemical up to a fill level and to additionally define an inner gas volume above the fill level;

said sidewall member having a protuberance that extends into the internal vessel compartment adjacent to the top wall member;

said top wall member and said sidewall member having opposing flat surfaces, wherein the opposing flat surfaces are optionally in contact with one another;

fastening means for securing said top wall member to said sidewall member through the opposing flat surfaces that are optionally in contact with one another;

said top wall member and said protuberance having opposing flat surfaces, wherein the opposing flat surfaces are not in contact with one another and at least a portion of the opposing flat surfaces are hardened;

a metal seal aligned and in contact with the hardened opposing flat surfaces of said top wall member and said protuberance;

said bottom wall member having a main floor surface containing a sump cavity therein extending downwardly from the main floor surface, the sump cavity being bounded at its lower end by a sub-floor surface, with at least a portion of the sump cavity being centrally located on the bottom wall member and at least a portion of the sump cavity being non-centrally located on the bottom wall member;

a temperature sensor extending from an upper end exterior of the vessel through a centrally located portion of the top wall member and generally vertically downwardly through the inner gas volume into the source chemical to a lower end of that portion of the sump cavity centrally located on the bottom wall member, with the lower end of the temperature sensor being located in non-interfering proximity to the sub-floor surface of the sump cavity;

a source chemical level sensor extending from an upper end exterior of the vessel through a non-centrally located portion of the top wall member and generally vertically downwardly through the inner gas volume into the source chemical to a lower end of that portion of the sump cavity non-centrally located on the bottom wall member, with the lower end of the source chemical level sensor being located in non-interfering proximity to the sub-floor surface of the sump cavity;

the temperature sensor being operatively arranged in the sump cavity to determine the temperature of source chemical in the vessel, the source chemical level sensor being operatively arranged in the sump cavity to determine the level of source chemical in the vessel, the temperature sensor and source chemical level sensor being located in non-interfering proximity to each other in the sump cavity, with the lower end of the temperature sensor being located at the same or closer proximity to the sub-floor surface of the sump cavity in relation to the lower end of the source chemical level sensor, and the temperature sensor and source chemical level sensor being in source chemical flow communication in the sump cavity; and a non-centrally located portion of the top wall member having a carrier gas feed inlet opening comprising a bubbler tube that extends through the inner gas volume into the source chemical and through which said carrier gas can be bubbled into the source chemical to cause at least a portion of source chemical vapor to become entrained in said carrier gas to produce a flow of vapor phase reagent to said inner gas volume above the fill level, said bubbler tube having an inlet end adjacent to the top wall member and an outlet end adjacent to the bottom wall member; and a non-centrally located portion of the top wall member having a vapor phase reagent outlet opening through which said vapor phase reagent can be dispensed from said apparatus;

wherein said hardened opposing flat surfaces of said top wall member and said protuberance have a hardness greater than the hardness of said metal seal.

2. The vapor phase reagent dispensing apparatus of claim 1 wherein the metal seal comprises an outer metal jacket, an inner elastomeric material or spring, and optionally a liner positioned between said outer metal jacket and said inner elastomeric material or spring.

3. The vapor phase reagent dispensing apparatus of claim 2 wherein the outer metal jacket includes a projection which is annularly formed at a top exterior surface and which abuts against the hardened flat surface of the top wall member, and a projection which is annularly formed at a bottom exterior surface and which abuts against the hardened flat surface of the protuberance.

4. The vapor phase reagent dispensing apparatus of claim 1 wherein the metal seal comprises an annular shaped seal having a cross section provided with an outer circumferential opening and formed in a laterally C-shape or U-shape.

5. The vapor phase reagent dispensing apparatus of claim 1 wherein the hardened opposing flat surfaces of the top wall member and the protuberance are formed by burnishing said opposing flat surfaces.

6. The vapor phase reagent dispensing apparatus of claim 1 wherein the hardened opposing flat surfaces of the top wall member and the protuberance are formed by incorporating a hardening material into the opposing flat surfaces.

7. The vapor phase reagent dispensing apparatus of claim 6 wherein the hardening material comprises Stellite.

8. The vapor phase reagent dispensing apparatus of claim 1 wherein the vessel is made of stainless steel and the outer metal jacket is made of stainless steel.

9. The vapor phase reagent dispensing apparatus of claim 1 having a helium leak rate (unfilled container testing procedure) of less than $9 \times 10^{-9}$ standard cubic centimeters per second.

10. The vapor phase reagent dispensing apparatus of claim 1 further comprising:
a carrier gas feed line extending from the carrier gas feed inlet opening upwardly and exteriorly from the top wall member for delivery of carrier gas into said source chemical, the carrier gas feed line containing a carrier gas flow control valve therein for control of flow of the carrier gas therethrough; and
a vapor phase reagent discharge line extending from the vapor phase reagent outlet opening upwardly and exteriorly from the top wall member for removal of vapor phase reagent from said inner gas volume above the fill level, the vapor phase reagent discharge line containing a vapor phase reagent flow control valve therein for control of flow of the vapor phase reagent therethrough.

11. The vapor phase reagent dispensing apparatus of claim 10 further comprising the vapor phase reagent discharge line in vapor phase reagent flow communication with a vapor phase delivery deposition system, said deposition system selected from a chemical vapor deposition system and an atomic layer deposition system.

12. The vapor phase reagent dispensing apparatus of claim 10 further comprising a carrier gas source coupled to the carrier gas feed line.

13. The vapor phase reagent dispensing apparatus of claim 10 further comprising:
a deposition chamber selected from a chemical vapor deposition chamber and an atomic layer deposition chamber;

the vapor phase reagent discharge line connecting the vapor phase reagent dispensing apparatus to the deposition chamber;

a heatable susceptor contained within the deposition chamber and located in a receiving relationship to the vapor phase reagent discharge line; and an effluent discharge line connected to the deposition chamber;

such that vapor phase reagent passes through the vapor phase reagent discharge line and into the deposition chamber, for contact with a substrate on the heatable susceptor and any remaining effluent is discharged through the effluent discharge line.

14. The vapor phase reagent dispensing apparatus of claim 13 wherein said substrate is comprised of a material selected from a metal, a metal silicide, a semiconductor, an insulator and a barrier material.

15. The vapor phase reagent dispensing apparatus of claim 13 wherein said substrate is a patterned wafer.

16. The vapor phase reagent dispensing apparatus of claim 1 wherein the sump cavity comprises a minor fraction of the area of the bottom wall member.

17. The vapor phase reagent dispensing apparatus of claim 1 wherein the sump cavity is defined at least in part by a sloping wall surface.

18. The vapor phase reagent dispensing apparatus of claim 1 wherein the sump cavity has two or three intersecting circular depressions in top plan view of the bottom wall member surface.

19. The vapor phase reagent dispensing apparatus of claim 1 wherein the sump cavity comprises two or three transversely spaced-apart circular depressions in source chemical flow communication with one another, with one of the circular depressions having the lower end of the temperature sensor disposed therein and another of the circular depressions having the lower end of the source chemical level sensor disposed therein.

20. The vapor phase reagent dispensing apparatus of claim 1 wherein the lower end of the source chemical level sensor is in sufficiently close proximity to the sub-floor surface of the sump cavity to permit utilization of at least 95% of source chemical when source chemical is contained in the vessel.

21. The vapor phase reagent dispensing apparatus of claim 1 wherein said source chemical level sensor is selected from the group consisting of ultrasonic sensors, optical sensors, capacitive sensors and float-type sensors, and said temperature sensor comprises a thermowell and thermocouple.

22. The vapor phase reagent dispensing apparatus of claim 1 wherein the vessel comprises a cylindrically shaped side wall member or side wall members defining a non-cylindrical shape.

23. The vapor phase reagent dispensing apparatus of claim 1 wherein the source chemical comprises a liquid or solid material.

24. The vapor phase reagent dispensing apparatus of claim 1 wherein the source chemical comprises a precursor for a metal selected from ruthenium, hafnium, tantalum, molybdenum, platinum, gold, titanium, lead, palladium, zirconium, bismuth, strontium, barium, calcium, antimony and thallium, or a precursor for a metalloid selected from silicon and germanium.

25. The vapor phase reagent dispensing apparatus of claim 1 wherein the vapor or liquid phase reagent comprises a precursor for a metal selected from ruthenium, hafnium, tantalum, molybdenum, platinum, gold, titanium, lead, palladium, zirconium, bismuth, strontium, barium, calcium, antimony and thallium, or a precursor for a metalloid selected from silicon and germanium.

26. A method for delivery of a vapor phase reagent to a deposition chamber comprising:

(a) providing a vapor phase reagent dispensing apparatus comprising:

a vessel which comprises a removable top wall member, a sidewall member and a bottom wall member configured to form an internal vessel compartment to hold a source chemical up to a fill level and to additionally define an inner gas volume above the fill level;

said sidewall member having a protuberance that extends into the internal vessel compartment adjacent to the top wall member;

said top wall member and said sidewall member having opposing flat surfaces, wherein the opposing flat surfaces are optionally in contact with one another;

fastening means for securing said top wall member to said sidewall member through the opposing flat surfaces that are optionally in contact with one another;

said top wall member and said protuberance having opposing flat surfaces, wherein the opposing flat surfaces are not in contact with one another and at least a portion of the opposing flat surfaces are hardened;

a metal seal aligned and in contact with the hardened opposing flat surfaces of said top wall member and said protuberance;

said bottom wall member having a main floor surface containing a sump cavity therein extending downwardly from the main floor surface, the sump cavity being bounded at its lower end by a sub-floor surface, with at least a portion of the sump cavity being centrally located on the bottom wall member and at least a portion of the sump cavity being non-centrally located on the bottom wall member;

a temperature sensor extending from an upper end exterior of the vessel through a centrally located portion of the top wall member and generally vertically downwardly through the inner gas volume into the source chemical to a lower end of that portion of the sump cavity centrally located on the bottom wall member, with the lower end of the temperature sensor being located in non-interfering proximity to the sub-floor surface of the sump cavity;

a source chemical level sensor extending from an upper end exterior of the vessel through a non-centrally located portion of the top wall member and generally vertically downwardly through the inner gas volume into the source chemical to a lower end of that portion of the sump cavity non-centrally located on the bottom wall member, with the lower end of the source chemical level sensor being located in non-interfering proximity to the sub-floor surface of the sump cavity;

the temperature sensor being operatively arranged in the sump cavity to determine the temperature of source chemical in the vessel, the source chemical level sensor being operatively arranged in the sump cavity to determine the level of source chemical in the vessel, the temperature sensor and source chemical level sensor being located in non-interfering proximity to each other in the sump cavity, with the lower end of the temperature sensor being located at the same or closer proximity to the sub-floor surface of the sump cavity in relation to the lower end of the source chemical level sensor, and the temperature sensor and source chemical level sensor being in source chemical flow communication in the sump cavity;

a non-centrally located portion of the top wall member having a carrier gas feed inlet opening comprising a bubbler tube that extends through the inner gas volume into the source chemical and through which said carrier gas can be bubbled into the source chemical to cause at least a portion of source chemical vapor to become entrained in said carrier gas to produce a flow of vapor phase reagent to said inner gas volume above the fill level, said bubbler tube having an inlet end adjacent to the top wall member and an outlet end adjacent to the bottom wall member;

a carrier gas feed line extending from the carrier gas feed inlet opening upwardly and exteriorly from the top wall member for delivery of carrier gas into said source chemical, the carrier gas feed line containing a carrier gas flow control valve therein for control of flow of the carrier gas therethrough;

a non-centrally located portion of the top wall member having a vapor phase reagent outlet opening through which said vapor phase reagent can be dispensed from said apparatus; and a vapor phase reagent discharge line extending from the vapor phase reagent outlet opening upwardly and exteriorly from the top wall member for removal of vapor phase reagent from said inner gas volume above the fill level, the vapor phase reagent discharge line containing a vapor phase reagent flow control valve therein for control of flow of the vapor phase reagent therethrough;

wherein said hardened opposing flat surfaces of said top wall member and said protuberance have a hardness greater than the hardness of said metal seal;

(b) adding source chemical at ambient temperature to said vapor phase reagent dispensing apparatus;

(c) heating the source chemical in said vapor phase reagent dispensing apparatus to a temperature sufficient to vaporize the source chemical to provide vapor phase reagent;

(d) feeding a carrier gas into said vapor phase reagent dispensing apparatus through said carrier gas feed line and said bubbler tube;

(e) withdrawing the vapor phase reagent and carrier gas from said vapor phase reagent dispensing apparatus through said vapor phase reagent discharge line; and (f) feeding the vapor phase reagent and carrier gas into said deposition chamber.

27. The method of claim 26 further comprising:

(g) contacting the vapor phase reagent with a substrate on a heatable susceptor within the deposition chamber; and (h) discharging any remaining effluent through an effluent discharge line connected to the deposition chamber.

28. The method of claim 27 wherein said substrate is comprised of a material selected from a metal, a metal silicide, a semiconductor, an insulator and a barrier material.

29. The method of claim 27 wherein said substrate is a patterned wafer.

30. The method of claim 26 in which the deposition chamber is selected from a chemical vapor deposition chamber and an atomic layer deposition chamber.

* * * * *